United States Patent
Glass et al.

(10) Patent No.: US 12,550,401 B2
(45) Date of Patent: Feb. 10, 2026

(54) DOPED STI TO REDUCE SOURCE/DRAIN DIFFUSION FOR GERMANIUM NMOS TRANSISTORS

(71) Applicant: Intel Corporation, Santa Clara, CA (US)

(72) Inventors: Glenn A. Glass, Portland, OR (US); Anand S. Murthy, Portland, OR (US); Karthik Jambunathan, Hillsboro, OR (US); Cory C. Bomberger, Portland, OR (US); Tahir Ghani, Portland, OR (US); Jack T. Kavalieros, Portland, OR (US); Benjamin Chu-Kung, Portland, OR (US); Seung Hoon Sung, Portland, OR (US); Siddharth Chouksey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 16/641,030

(22) PCT Filed: Sep. 29, 2017

(86) PCT No.: PCT/US2017/054289
§ 371 (c)(1),
(2) Date: Feb. 21, 2020

(87) PCT Pub. No.: WO2019/066895
PCT Pub. Date: Apr. 4, 2019

(65) Prior Publication Data
US 2020/0365711 A1   Nov. 19, 2020

(51) Int. Cl.
*H01L 29/66* (2006.01)
*H01L 21/762* (2006.01)
(Continued)

(52) U.S. Cl.
CPC ..... *H10D 64/017* (2025.01); *H01L 21/76237* (2013.01); *H10D 30/751* (2025.01);
(Continued)

(58) Field of Classification Search
CPC ..... H01L 21/76224–76237; H01L 21/823481; H01L 21/823878;
(Continued)

(56) References Cited

U.S. PATENT DOCUMENTS 9,691,766 B1 * 6/2017 Lin .................. H01L 29/66803
9,741,850 B1   8/2017 Hsiao et al.
(Continued)

FOREIGN PATENT DOCUMENTS

JP   2004228557      8/2004
JP   2017130608 A    7/2017
(Continued)

OTHER PUBLICATIONS

International Preliminary Report on Patentability for International Application No. PCT/US2017/054289 issued Mar. 31, 2020, 7 pages.
(Continued)

*Primary Examiner* — Julio J Maldonado
*Assistant Examiner* — Stanetta D Isaac
(74) *Attorney, Agent, or Firm* — Schwabe, Williamson & Wyatt P.C.

(57) ABSTRACT

Integrated circuit transistor structures are disclosed that reduce n-type dopant diffusion, such as phosphorous or arsenic, from the source region and the drain region of a germanium n-MOS device into adjacent shallow trench isolation (STI) regions during fabrication. The n-MOS transistor device may include at least 75% germanium by atomic percentage. In an example embodiment, the STI is doped with an n-type impurity, in regions of the STI adjacent to the
(Continued)

source and/or drain regions, to provide dopant diffusion reduction. In some embodiments, the STI region is doped with an n-type impurity including Phosphorous in a concentration between 1 and 10% by atomic percentage. In some embodiments, the thickness of the doped STI region may range between 10 and 100 nanometers.

22 Claims, 16 Drawing Sheets

(51) Int. Cl.
| | |
|---|---|
| *H01L 21/8238* | (2006.01) |
| *H01L 29/10* | (2006.01) |
| *H10D 30/01* | (2025.01) |
| *H10D 30/69* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 84/0193* (2025.01); *H10D 84/038* (2025.01); *H10D 30/0241* (2025.01)

(58) Field of Classification Search
CPC .................. H01L 2027/11829–11833; H01L 2027/1189–11892; H01L 21/76802–76817; H01L 21/76877–76883; H01L 21/02636–02653; H01L 21/2018; H01L 21/2033–2036; H01L 21/2053–2056; H01L 21/2085; H01L 21/28562; H01L 21/76262; H01L 21/76278; H01L 21/76294; H01L 21/76879; H01L 51/0011; H01L 21/31155; C23C 14/04–048; C23C 16/04–047; H10D 30/0241; H10D 30/62; H10D 30/751; H10D 84/0193; H10D 84/038; H10D 64/017
See application file for complete search history.

(56) References Cited

U.S. PATENT DOCUMENTS

| | | | |
|---|---|---|---|
| 2007/0161225 A1* | 7/2007 | Peters | H01L 21/76897 257/E21.507 |
| 2007/0202635 A1* | 8/2007 | Ellis-Monaghan | H01L 29/045 438/149 |
| 2014/0021517 A1 | 1/2014 | Cheng et al. | |
| 2014/0027860 A1* | 1/2014 | Glass | H01L 21/823807 257/E27.06 |
| 2014/0327084 A1 | 11/2014 | Feilchenfeld et al. | |
| 2015/0155381 A1* | 6/2015 | Song | H01L 29/0653 257/408 |
| 2016/0155668 A1 | 6/2016 | Yeh et al. | |
| 2016/0233319 A1* | 8/2016 | Lu | H10D 62/371 |
| 2016/0268382 A1* | 9/2016 | Colinge | H01L 29/66969 |
| 2016/0322462 A1* | 11/2016 | Chou | H01L 29/7849 |
| 2017/0125411 A1* | 5/2017 | Yu | H01L 21/823431 |
| 2017/0256611 A1* | 9/2017 | Kim | H10D 84/038 |
| 2018/0076202 A1* | 3/2018 | Basker | H01L 29/161 |

FOREIGN PATENT DOCUMENTS

| | | |
|---|---|---|
| WO | WO 2016/209219 | 12/2016 |
| WO | 2019066895 A1 | 4/2019 |

OTHER PUBLICATIONS

International Search Report and Written Opinion received for PCT Application No. PCT/US2017/054289. Date of Mailing:Jun. 28, 2018. 12 pages.
Office Action from Korean Patent Application No. 201780094407.7, mailed Sep. 30, 2024, 9 pgs.
Office Action from Chinese Patent Application No. 201780094407.7, mailed Apr. 25, 2025, 6 pgs.
Notice of Allowance from Chinese Patent Application No. 201780094407.7, mailed Jul. 1, 2025, 4 pgs.

* cited by examiner

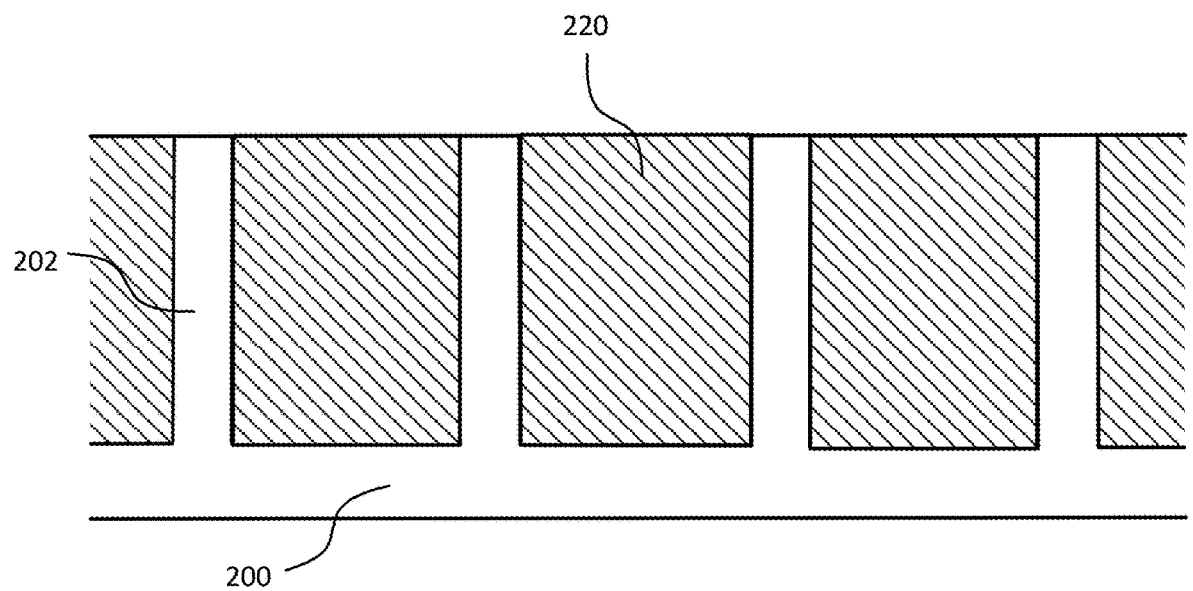
FIG. 2F
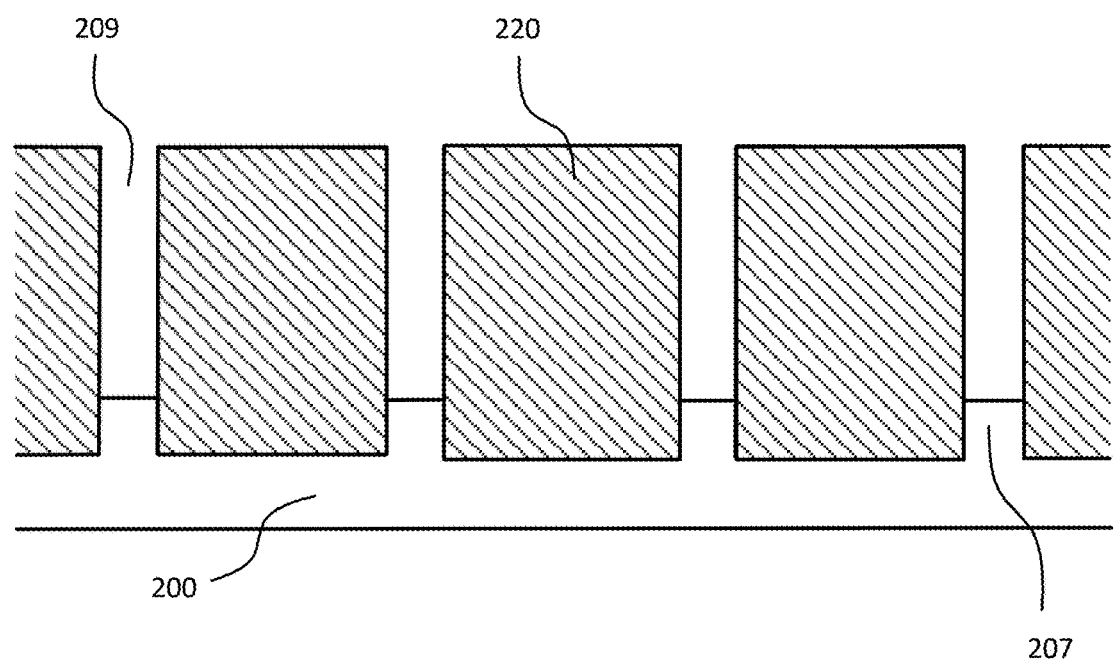
FIG. 2G
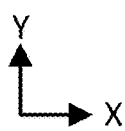

DOPED STI TO REDUCE SOURCE/DRAIN DIFFUSION FOR GERMANIUM NMOS TRANSISTORS

CROSS REFERENCE TO RELATED APPLICATIONS

This application is a U.S. national stage entry under 35 U.S.C. § 371(c) of International Application No. PCT/US17/54289, filed Sep. 29, 2017, the disclosure of which is incorporated by reference herein in its entirety.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1A:
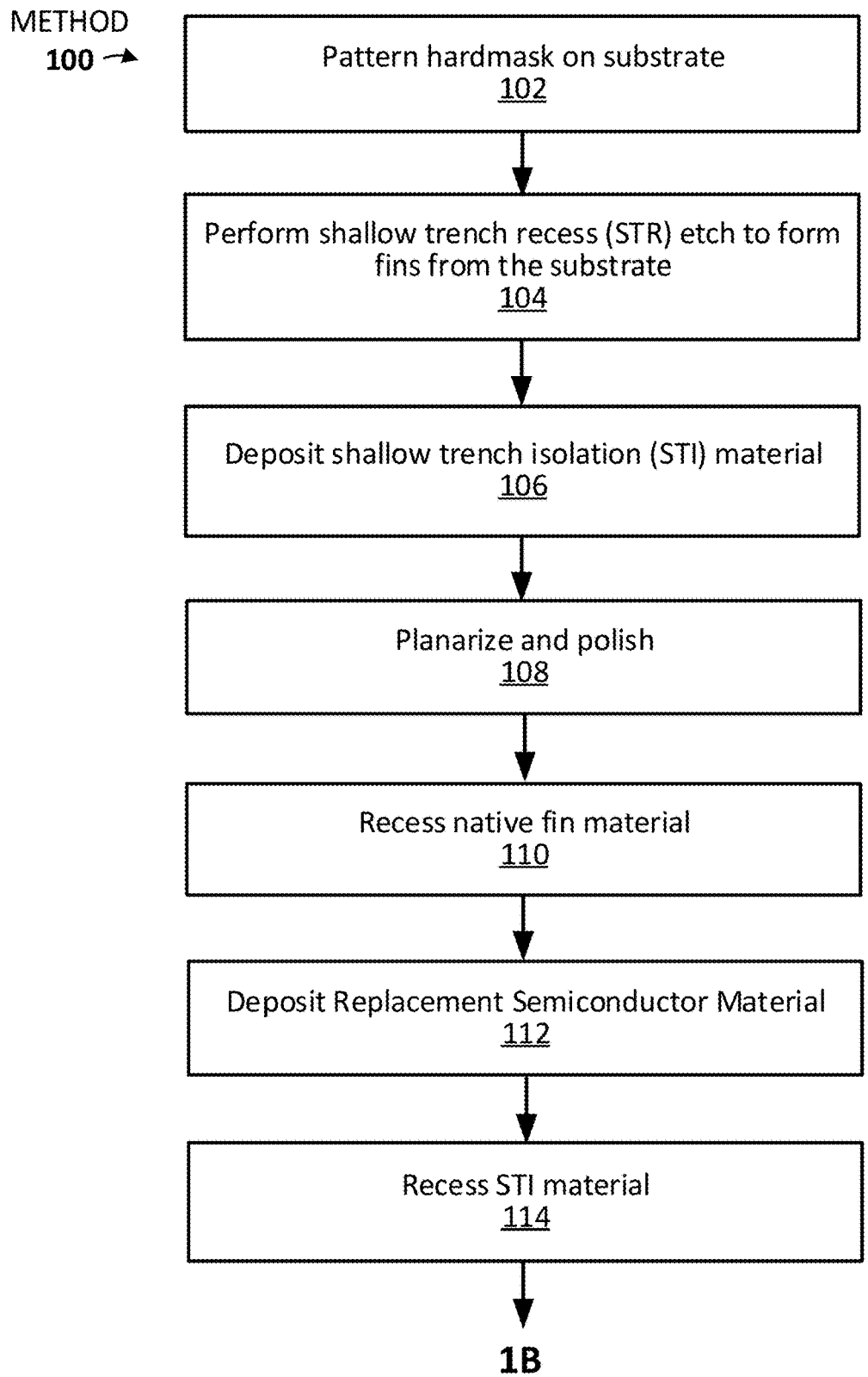
FIGS. 1A-1B illustrate a method of forming an integrated circuit (IC) including at least one germanium (Ge)-rich n-MOS transistor employing a doped shallow trench isolation (STI) region, specifically, to help prevent source/drain (S/D) dopant from diffusing into surrounding STI material, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually differentiating the different features. In short, the figures are provided merely to show example structures Although the following Detailed Description will proceed with reference being made to illustrative embodiments, many alternatives, modifications, and variations thereof will be apparent in light of this disclosure.

DETAILED DESCRIPTION

Integrated circuit transistor structures are disclosed that reduce n-type dopant diffusion, such as phosphorous or arsenic, from the source and drain regions into adjacent shallow trench isolation (STI) regions during fabrication of n-MOS devices having a germanium-rich channel (e.g., germanium concentration of 75 atomic % or more, up to 100 atomic %). In an example embodiment, the structure includes STI regions, adjacent to the source and drain (S/D) regions, the STI regions doped with an n-type impurity, to effectively provide dopant diffusion reduction from the S/D regions. In some embodiments, the n-type impurity is Phosphorous (P), which is implanted in the STI proximate the source/drain regions after forming the gate structure, such that the gate structure prevents dopant implantation in regions of the STI adjacent to the channel region under the gate structure. In some embodiments, the concentration of n-type impurity implanted in the STI material is in the range of 1 to 10 atomic %. In some embodiments, the thickness of the n-doped portion of the STI region to either side of the source/drain regions is in the range of 10 nanometers to 100 nanometers. Numerous configurations and process flows will be apparent in light of this disclosure.

General Overview

The fabrication of Ge-rich n-MOS transistors is generally not practical due to the difficulty of maintaining a relatively high level of n-type dopant in the source/drain regions of the transistor. This is largely due to the physical properties of Ge, wherein typical n-type dopants, such as phosphorous and arsenic, readily diffuse from the Ge-rich source/drain regions under the high temperature conditions associated with semiconductor fabrication processes. For instance, Ge-rich n-MOS devices are susceptible to spilling of the n-type dopant from the S/D regions into the isolation trench material that separates and insulates adjacent transistors. This spilling is particularly problematic under the high temperature conditions associated with the semiconductor fabrication process. The resulting transistor device can exhibit poor S/D contact resistance due to the high energy barrier at the metal-semiconductor interface, which cannot be overcome by tunneling due to the low dopant levels resulting from dopant diffusion out of the Ge material. Such high S/D contact resistance can cause significant performance degradation. These issues, resulting from dopant diffusion, are further exacerbated as transistor devices are scaled down to include smaller critical dimensions, for example using sub-30 nm technology, and beyond.

Thus, and in accordance with numerous embodiments of the present disclosure, techniques are provided for forming Ge-rich n-MOS transistors that include STI regions, adjacent to the source and drain (S/D) regions, the STI regions doped with an n-type impurity, to effectively provide dopant diffusion reduction from the S/D regions, as will be described in greater detail below. As can be understood based on this disclosure, the doped STI regions proximate the source/drain regions helps to inhibit the undesired diffusion of dopant (e.g., P, or As) from the S/D regions into the adjacent STI regions. The STI dopant n-type impurity, for example P, provides improved diffusion resistance properties as it reduces the dopant gradient between the S/D regions and the STI. In general, the doped STI regions can effectively act as a dopant reflector wherein approximately the same quantities of dopant diffuse in opposite directions (e.g., from S/D region to doped STI region, and from doped STI region back to S/D region), due to the relatively high concentration of dopant impurity in the doped STI region. For example, in some embodiments, the doped STI region may have 2 to 10 times the dopant concentration of the S/D regions.

In some embodiments, the concentration of n-type impurity implanted in the STI material proximate the source/drain regions is in the range of 1 to 10 atomic %. In some embodiments, the thickness of the n-doped portion of the STI region to either side of the source/drain regions is in the range of 10 nanometers to 100 nanometers.

Note that, as used herein, "Ge-rich" includes a Ge-containing body that includes over 50% Ge by atomic percentage, where the Ge or $Si_{1-x}Ge_x$ (x>0.5) may be doped with any suitable material(s) and/or alloyed with other group IV elements (e.g., carbon and/or tin up to 2% by atomic percentage). For instance, in some embodiments, the Ge-rich material may be n-type doped, such as Ge:As, Ge:P, SiGe:P (with over 50% Ge by atomic percentage), or SiGe:As (with over 50% Ge by atomic percentage), to provide some examples. Further, in some embodiments, the Ge-rich material may include alloying of carbon and/or tin, such as Ge:C, GeSn, SiGe:C, SiGeSn, GeSn:C, SiGeSn:C. Also note, that in some embodiments, Ge-rich may include a different threshold concentration (by atomic percentage) of Ge, such as at least 55, 60, 65, 70, 75, 80, 85, 90, or 95%, for example. For instance, in some applications, embodiments where a Ge-rich channel region of a transistor includes at least 80% Ge by atomic percentage may be desired, or even a pure Ge channel, such as to achieve a desired charge carrier mobility, for example. Further note that the inclusion of Ge-rich material in a given feature as described herein does not preclude the inclusion of materials other than Ge. For instance, in some embodiments, a Ge-rich channel region may include a multilayer structure that includes at least one Ge-rich layer and at least one non-Ge-rich layer. However, in other embodiments, a Ge-rich feature has Ge-rich material be throughout essentially the entirety of that feature. Moreover, a Ge-rich channel region may include grading of the concentration of Ge throughout at least a portion of the channel region, such that there may be one or more portions of that channel region that include less than 50% Ge concentration by atomic percentage, and may even include no Ge content at all.

Also, as used herein, "group IV semiconductor material" (or "group IV material" or generally, "IV") includes at least one group IV element (e.g., silicon, germanium, carbon, tin), such as silicon (Si), germanium (Ge), silicon germanium (SiGe), and so forth. Note that alloys of group IV elements are not to be confused with compounds of those elements. Therefore, when carbon is alloyed with any of the other group IV elements, the resulting alloy will be expressed herein as "X:C", where "X" is the group IV element or alloy and ":C" indicates alloying with carbon. For instance, silicon alloyed with carbon may be referred to herein as Si:C (thereby preventing confusion with silicon carbide (SiC)), silicon germanium alloyed with carbon may be referred to herein as SiGe:C, germanium alloyed with carbon may be referred to herein as Ge:C (thereby preventing confusion with germanium carbide (GeC)), and so forth. Also note that the molecular ratio or the atomic percentage of the elements included in a group IV alloy can be adjusted as desired. Further note that the use of "X:Z" herein indicates a doping relationship where "X" is an element or alloy doped by "Z", such as arsenic-doped silicon germanium being represented by SiGe:As, or phosphorous-doped silicon germanium alloyed with carbon being represented by SiGe:C:P, to provide some examples. Generally, when referring to group IV semiconductor material as described herein (e.g., Si, SiGe, Ge, SiSn, SiGeSn, GeSn, Si:C, SiGe:C, Ge:C, SiSn:C, SiGeSn:C, GeSn:C), that group IV semiconductor material has a monocrystalline (or single-crystal) structure, unless otherwise stated, such as, for example, where polycrystalline silicon (or poly-Si) may be utilized, as stated herein.

In some embodiments, the techniques can be used to benefit a multitude of transistor devices. For instance, in some embodiments, the techniques may be used to benefit one or more n-channel transistor devices (where the charge carriers are electrons) such as n-channel MOSFET (n-MOS) devices. In some embodiments, the techniques described herein can be used to benefit complementary transistor circuits, such as CMOS circuits, where the techniques can be used to benefit one or more of the included n-channel transistors (e.g., n-MOS devices) making up a given CMOS circuit. Further still, in some embodiments, the techniques described herein can be used to benefit transistors including a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof, to provide a few examples. Other example transistor devices that can benefit from the techniques described herein include few to single electron quantum transistor devices, for example.

As will be further appreciated, the Ge-rich n-MOS transistors, including one or more doped STI regions configured to reduce diffusion from the source/drain fin structures to the STI regions, provided herein may also be intermixed on the same substrate with other transistor devices having channel regions devoid of any germanium, such as transistors having silicon channel regions, gallium arsenide channel regions, indium arsenide channel regions, gallium indium arsenide channel regions, or some combination of compositionally diverse channel regions. Further note that some channel regions may be native to the substrate (i.e., fins formed from the substrate), while other channel regions may be epitaxially provided on the substrate.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C. Likewise, the expression "X included in at least one of A and B refers to an X that may be included, for example, in just A only, in just B only, or in both A and B. The above discussion with respect to "X includes at least one of A and B" equally applies here, as will be appreciated.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including at least one Ge-rich n-MOS transistor that includes an STI region doped with n-type impurities, as described herein. For instance, in some such embodiments, the techniques may be detected by observing (e.g., via SEM/TEM) that P is present in an STI region adjacent to one or more S/D regions. In some embodiments, the techniques and structures described herein may be detected based on the benefits derived therefrom, such as by observing a Ge-rich n-MOS source/drain fin structure that does not exhibit reduced levels of dopant (e.g., P or As) resulting from diffusion into adjacent STI regions, as a result of the STI doping as described herein (e.g., as compared to Ge-rich n-MOS transistors that do not employ the techniques described herein). Thus, in some embodiments, the techniques described herein may enable forming enhanced performance Ge-rich transistor devices with sub-30 nm technology and beyond, which can also be detected and measured. Numerous configurations and variations will be apparent in light of this disclosure.

Methodology and Architecture

FIG. 1 (1A and 1B) illustrate method 100 of forming an integrated circuit (IC) including at least one Ge-rich n-MOS transistor employing STI regions doped with an n-type impurity, specifically, to help prevent or otherwise inhibit S/D dopant from diffusing into the adjacent isolation region or so-called STI region, in accordance with some embodiments of the present disclosure. FIGS. 2A-N illustrate example IC structures that are formed when carrying out method 100 of FIG. 1, in accordance with some embodiments. The structures of FIGS. 2A-N are primarily depicted and described herein in the context of forming finned or FinFET transistor configurations (e.g., tri-gate transistor configurations), for ease of illustration. However, in some embodiments, the techniques can be used to form transistors of any suitable geometry or configuration, as can be understood based on this disclosure. Also note that the techniques and structures are primarily depicted and described in the context of forming metal-oxide-semiconductor field-effect transistors (MOSFETs). However, the present disclosure is not intended to be so limited unless stated otherwise. Further note that method 100 includes a primary path that illustrates a gate last transistor fabrication process flow that can be employed in accordance with some embodiments. However, in other embodiments, a gate first process flow may be employed instead, as will be described herein (and which is illustrated with the alternative gate first flow 100' indicator in FIG. 1). Numerous variations and configurations will be apparent in light of this disclosure.

Figure 1B:
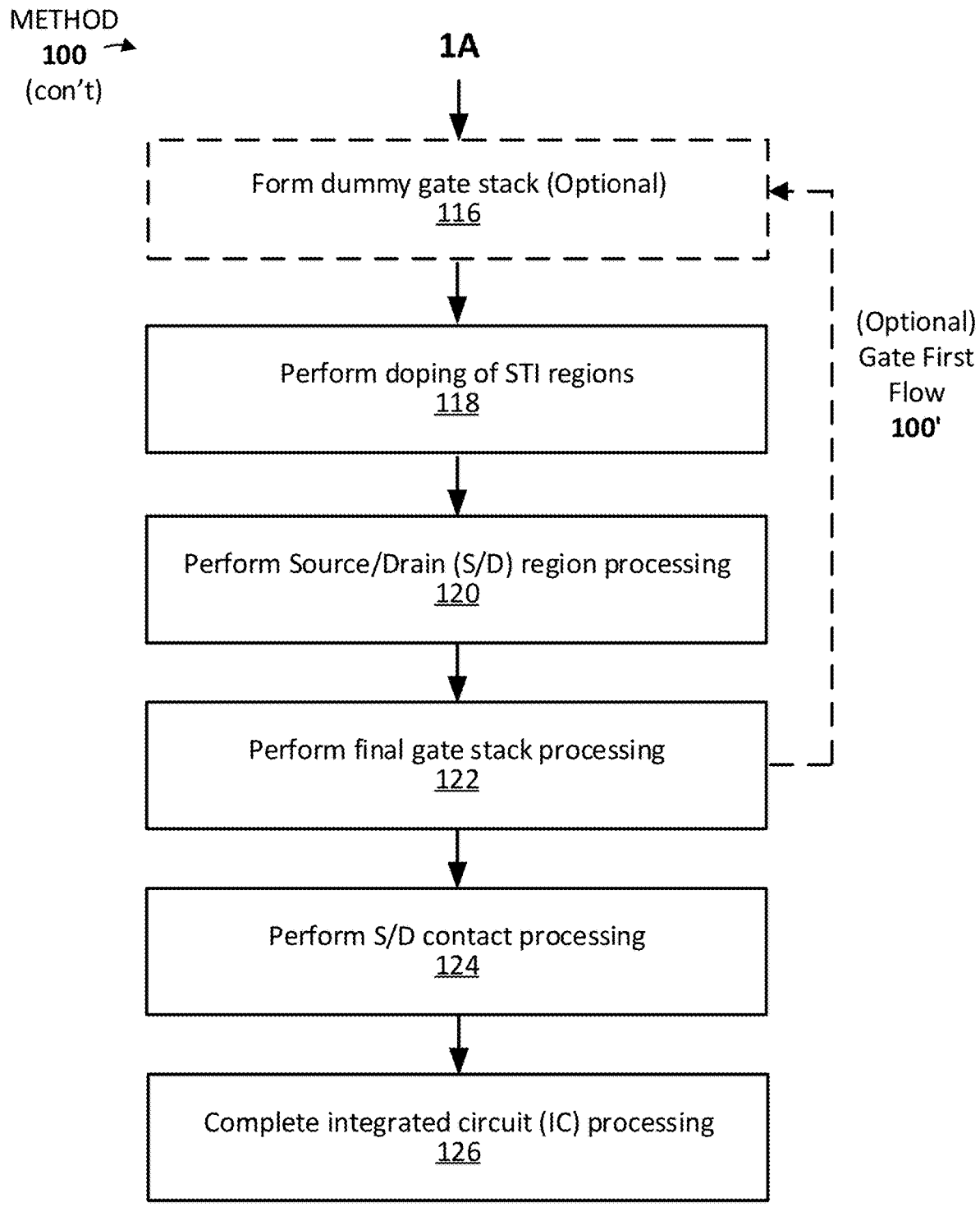
Figure 2A:
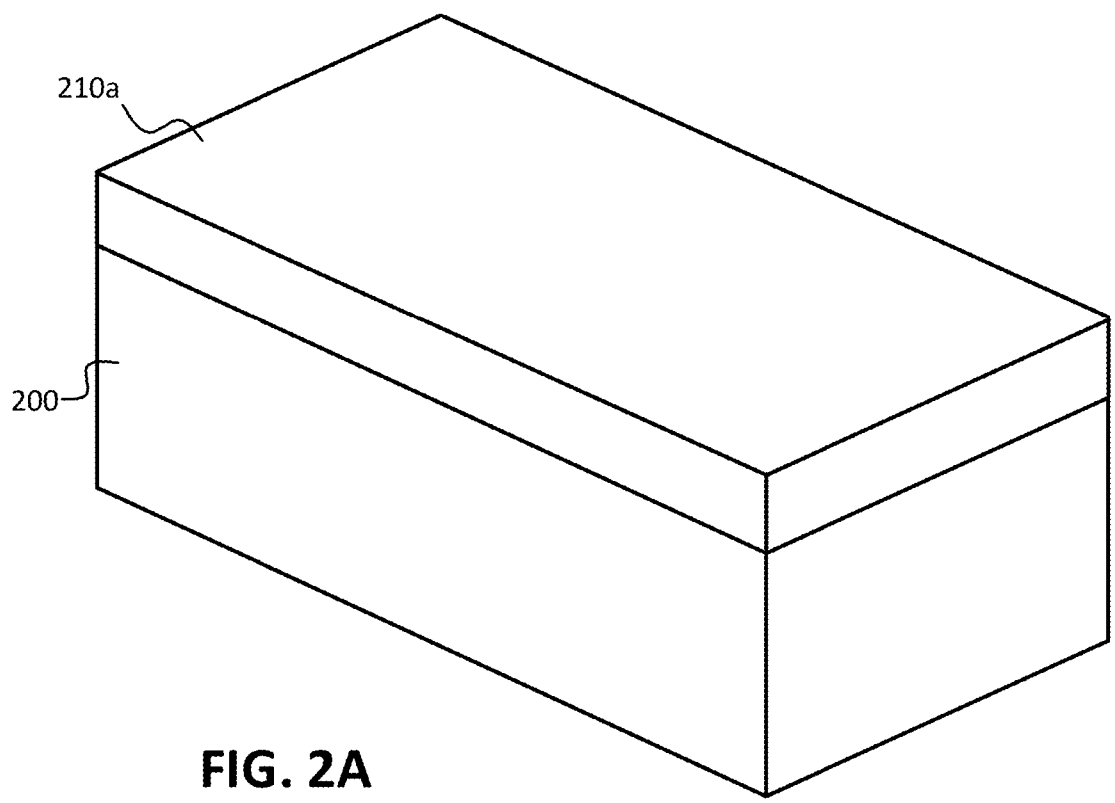
FIGS. 2A-2N illustrate example IC structures that are formed when carrying out the method of FIGS. 1A-1B, in accordance with some embodiments
Figure 2B:
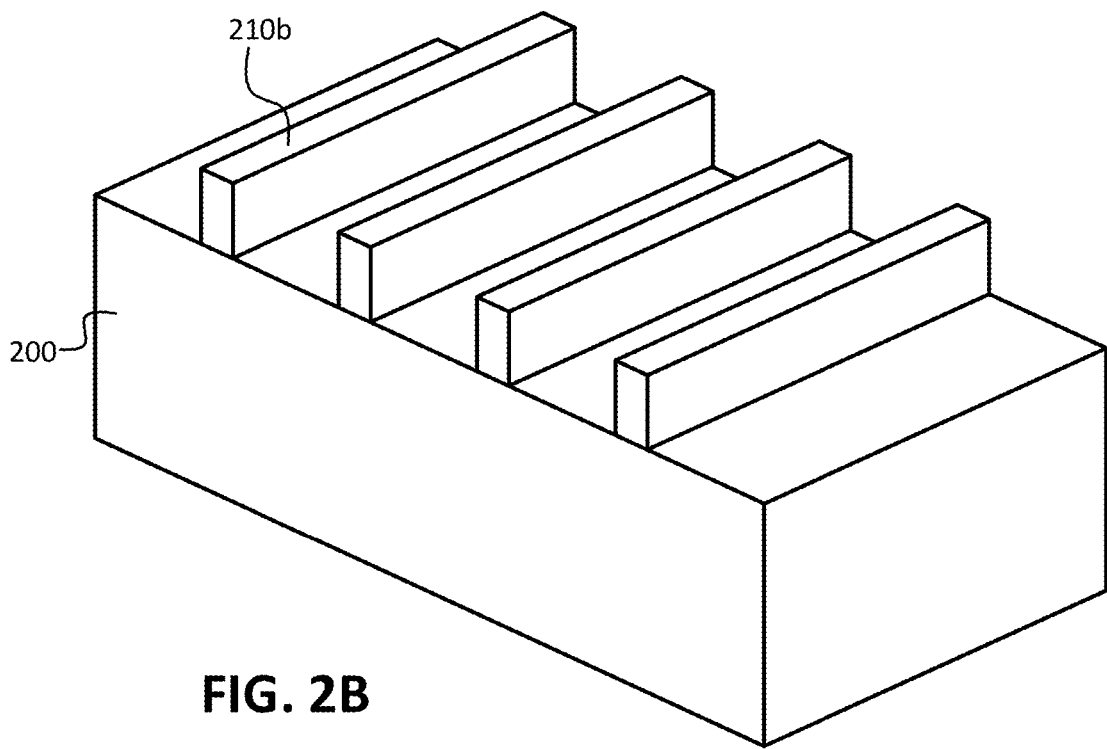

Method 100 of FIG. 1 (referring now to FIG. 1A) includes patterning 102 hardmask on a substrate, such as patterning hardmask 210a on substrate 200 of FIG. 2A to form the example structure 210b of FIG. 2B, in accordance with some embodiments. In some embodiments, hardmask 210a may be deposited or otherwise formed on substrate 200 using any suitable techniques as will be apparent in light of this disclosure. For example, hardmask 210a may be blanket deposited or otherwise grown on substrate 200 using chemical vapor deposition (CVD), atomic layer deposition (ALD), physical vapor deposition (PVD), spin-on processing, and/or any other suitable process to form hardmask 210a on substrate 200. In some instances, the top surface of substrate 200 on which hardmask 210a is to be deposited may be treated (e.g., via chemical treatment, thermal treatment, etc.) prior to deposition of the hardmask 210a material. After being blanket formed on substrate 200, hardmask 210a may then be patterned using any suitable techniques, such as one or more lithography and etch processes, for example, to produce structure 210b. Hardmask 210a may include any suitable material, such as oxide material, nitride material, and/or any other suitable masking material, for example. Specific oxide and nitride materials may include silicon oxide, titanium oxide, hafnium oxide, aluminum oxide, silicon nitride, and titanium nitride, just to name a few examples. In some cases, the material of hardmask 210a may be selected based on the material of substrate 200, for example.

Substrate 200, in some embodiments, may be: a bulk substrate including group IV semiconductor material (e.g., Si, Ge, SiGe), group III-V semiconductor material (e.g., GaAs, GaAsSb, GaAsIn), and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. In some embodiments, substrate 200 may include Ge-rich material to be used in the channel region of one or more transistors.

In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped (such as including a dopant concentration of less than 1E16 atoms per cubic cm), for example. In some embodiments, substrate 200 may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers shown in subsequent structures for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2C:
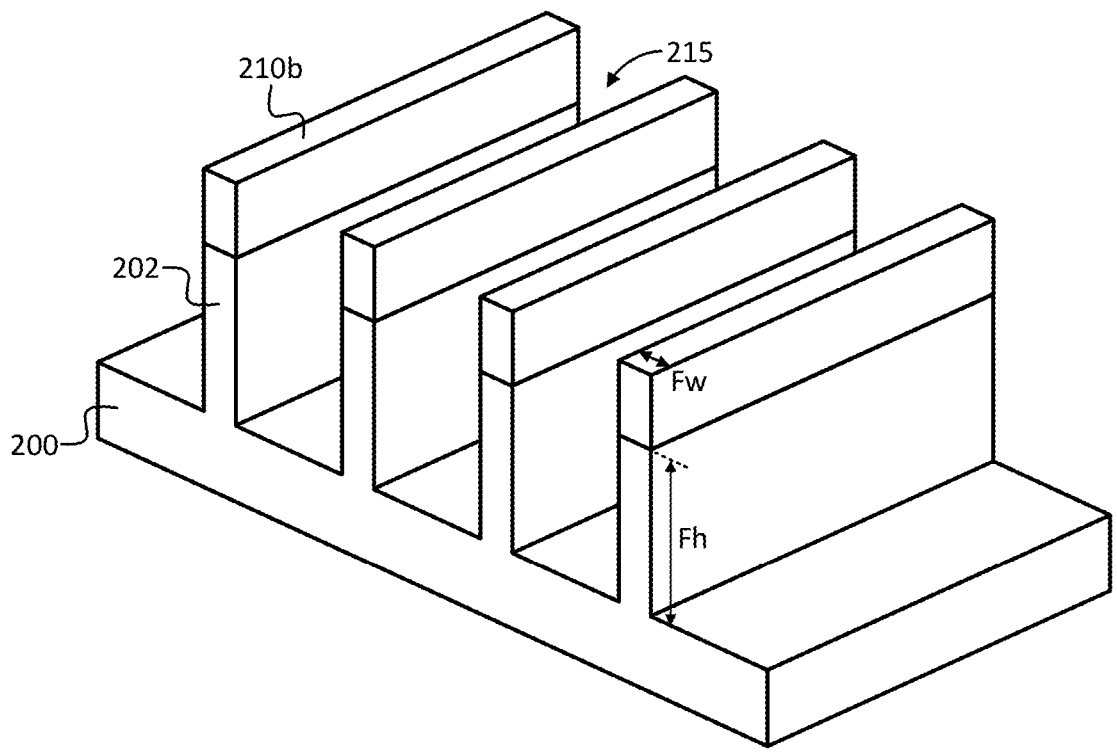

Method 100 of FIG. 1 continues with performing 104 a shallow trench recess (STR) etch to form fins 202 from substrate 200, thereby forming the resulting example structure shown in FIG. 2C, in accordance with some embodiments. In some embodiments, the STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 215 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 215 between fins 202. Fins 202 may be formed to have varying widths Fw (dimension in the X-axis direction) and heights Fh (dimension in the Y-axis direction). Note that although hardmask structures 210b are still present in the example structure of FIG. 2C, in some cases, that need not be the case, as they may have been consumed during the STR etch, for example. Further note that, while the fins 202 are shown as relatively rectangular in nature (with straight sides and a flat top) for ease of depiction, in reality, the fins may include a tapered profile where the top of the fin is narrower than the base of the fin (as viewed in a cross-section taken perpendicular to the fin). Moreover, the very top of the fin may be rounded, rather than flat. Numerous other real-world geometries will be appreciated.

Figure 2D:
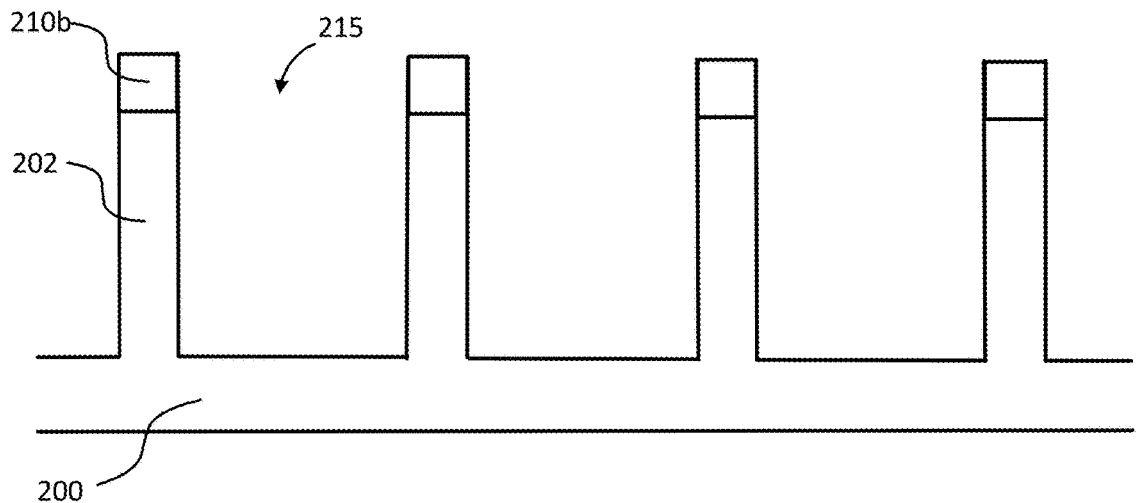

In some embodiments, the fin widths Fw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 5-20, 10-20, 10-50, 10-100, 10-200, 10-400, 50-100, 50-200, 50-400, 100-400 nm, or any other sub-range), for example, or any other suitable value or range as will be apparent in light of this disclosure. In some embodiments, the fin heights Fh (dimension in the vertical or Y-axis direction) may be in the range of 4-800 nm (or in a subrange of 4-10, 4-20, 4-50, 4-100, 4-200, 4-400, 10-20, 10-50, 10-80, 10-100, 10-200, 10-400, 10-800, 50-100, 50-200, 50-400, 50-800, 100-400, 100-800, 400-800 nm, or any other sub-range), for example, or any other suitable value or range as will be apparent in light of this disclosure. In some embodiments, the fin heights Fh may be at least 10, 25, 35, 50, 75, 100, 125, 150, 175, 200, 300, 400, 500, 600, 700, or 800 nm tall, or any other desired height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 215 and fins 202 are each shown as having essentially the same sizes and shapes in this example structure for ease of illustration; however, the present disclosure is not intended to be so limited. For example, in some embodiments, the fins 202 may be formed to have varying heights Fh, varying widths Fw, varying starting points (or varying starting heights), varying shapes, and/or any other suitable variations as will be apparent in light of this disclosure. Moreover, trenches 215 may be formed to have varying depths, varying widths, varying starting points (or varying starting depths), varying shapes, and/or any other suitable variations as will be apparent in light of this disclosure. Further note that although four fins 202 are shown in the example structure of FIG. 2C for ease of illustration, any number of fins may be formed, such as one, two, three, five, ten, hundreds, thousands, millions, and so forth, as can be understood based on this disclosure. FIG. 2D illustrates a cross-sectional (2-dimensional) view of the example structure shown in FIG. 2C for reference.

Figure 2E:
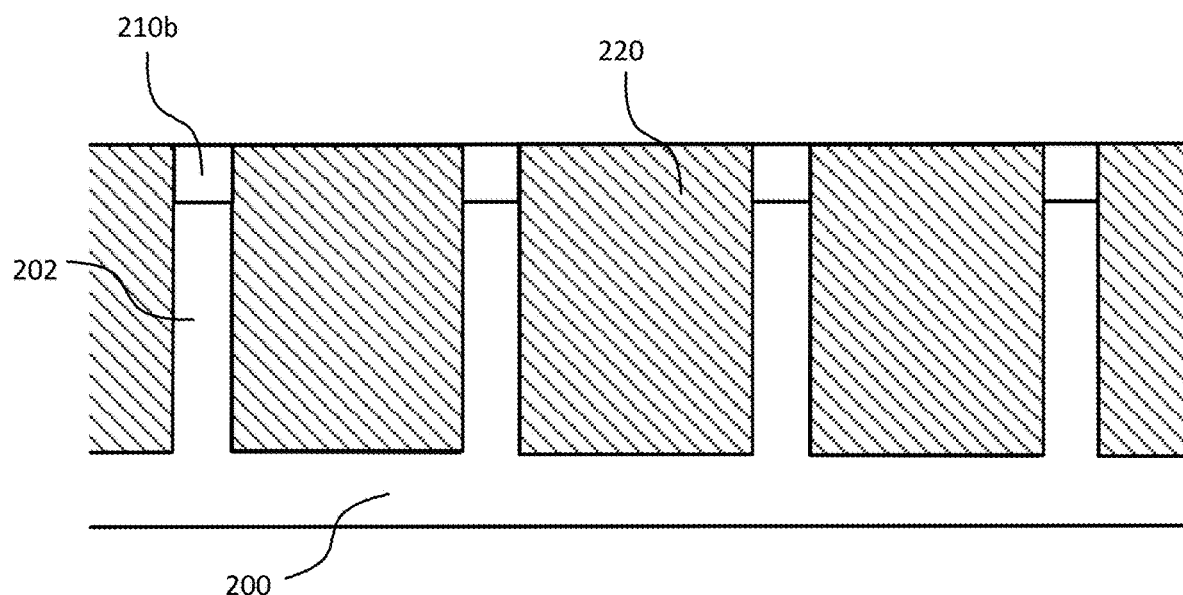
Figure 2E:
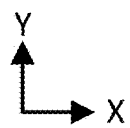

Method 100 of FIG. 1 continues with depositing 106 shallow trench isolation (STI) material 220 to form the example resulting structure of FIG. 2E, in accordance with some embodiments. Deposition 106 of STI material 220 may include any suitable deposition techniques, such as those described herein (e.g., CVD, ALD, PVD), or any other suitable deposition process. In some embodiments, STI material 220 (which may be referred to as an STI layer or STI structure) may include any suitable electrically insulating material, such as one or more dielectric, oxide (e.g., silicon dioxide), and/or nitride (e.g., silicon nitride) materials. In some embodiments, the material of STI layer 220 may be selected based on the material of substrate 200. For instance, in the case of a Si substrate, the STI material may be selected to be silicon dioxide or silicon nitride, to provide some examples. Method 100 of FIG. 1 further continues with planarizing/polishing 108 the structure to form the example resulting structure of FIG. 2F, in accordance with some embodiments. The planarizing and/or polishing process(es) performed after forming STI material 220 may include any suitable techniques, such as chemical-mechanical planarization/polishing (CMP) processes, for example. Note that the hardmask 210b is removed by this planarization, in this example embodiment. In other embodiments, the hardmask 210b may remain.

Method 100 of FIG. 1 continues with recessing 110 the native fin material 202. In embodiments where the fins 202 are to be removed and replaced with replacement semiconductor material (e.g., to be used in the channel region of one or more transistor devices), the structure of FIG. 2F enables such processing. For example, continuing from the structure of FIG. 2F to the structure of FIG. 2G, fins 202 may be recessed or removed using selective etch processing (e.g., for a given etchant, the semiconductor material of fins 202 is removed selective to the insulator material of STI layer 220) to form fin-shaped trenches 209 between STI material 220 in which replacement semiconductor material can be deposited/grown (e.g., using any suitable techniques, such as CVD, metal-organic CVD (MOCVD), ALD, molecular beam epitaxy (MBE), PVD). The depth of the etch can vary from one embodiment to the next. In the embodiment shown, a portion of the native fin is left so as to provide a pedestal or fin stub 207 on which the replacement fin material can be deposited. In other embodiments, the native fin can be completely removed, so as to be flush with the top surface of substrate 200 to provide no pedestal or fin stub, or even below the top surface of substrate 200 so as to provide an inverted pedestal or fin stub.

Figure 2H:
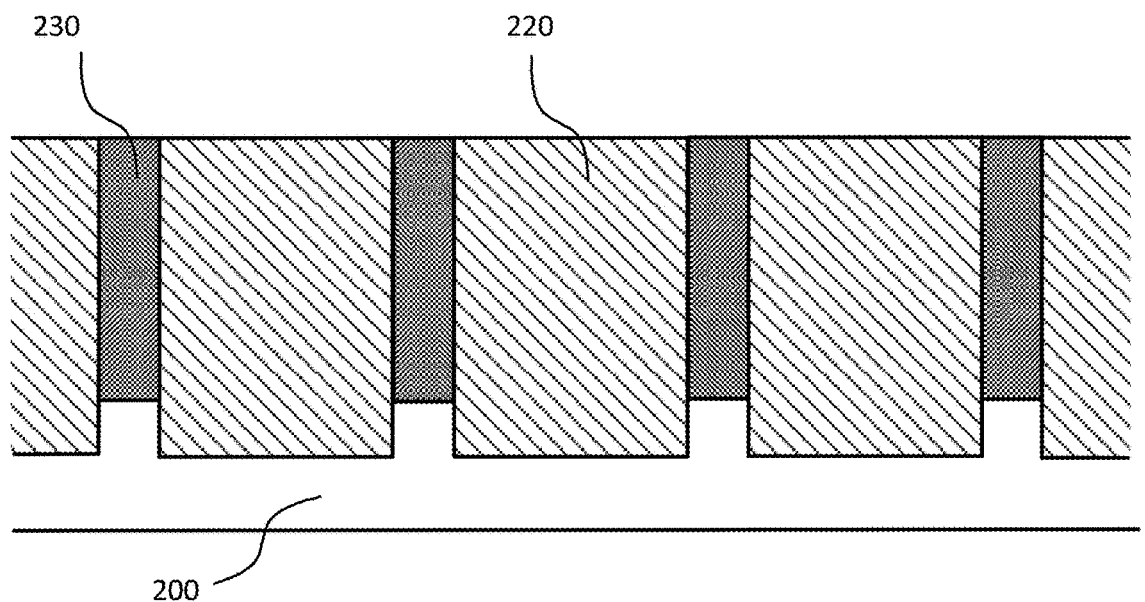

Method 100 of FIG. 1 continues with deposition 112 of replacement semiconductor fin material. For instance, FIG. 2H illustrates recess and replace processing to form a replacement material fin 230, in accordance with some embodiments. Replacement fin 230 (and generally, any replacement fin formed) may include any suitable semiconductor material (e.g., group IV and/or III-V semiconductor material). For instance, replacement fins including SiGe or Ge may be formed by removing native Si fins during such processing and replacing them with the SiGe or Ge material, to provide some examples. In addition, replacement fin 230 may include any suitable n-type or p-type dopant, or be undoped or lightly-doped. In some embodiments, replacement material fins, such as replacement fin 230 of FIG. 2H may be formed using alternative processing. For instance, in some embodiments, replacement material fins may be formed by blanket-growing the replacement material on the substrate (e.g., using epitaxial deposition processing) and then patterning the replacement material into replacement material fins, to provide an example alternative. Note that replacement fin 230 is illustrated with patterning/shading to merely assist with visually identifying that feature. In any such cases, the resulting structure can be planarized to provide a relatively flat top surface, as generally shown in FIG. 2H.

Figure 2I:
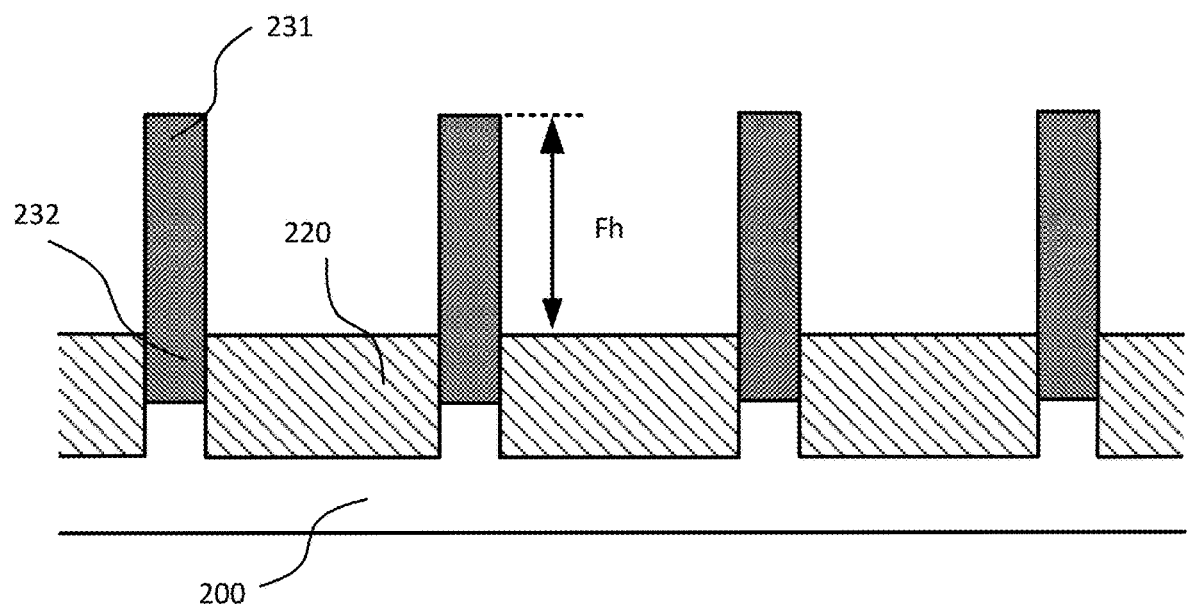
Figure 2I:
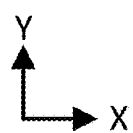

Method 100 of FIG. 1 continues with recessing 114 of the STI material 220 between fins, as shown in FIG. 2I, to cause at least a portion 231 of fins 230 to exude from the STI plane, thereby forming the resulting example structure shown in FIG. 2I, in accordance with some embodiments. Recessing 114 may be performed using any suitable techniques, such as using one or more wet and/or dry etch processes that allow the STI material 220 to be selectively recessed relative to the material of fin 230, and/or any other suitable processing as will be apparent in light of this disclosure. As can be understood based on this disclosure, exposed portions 231 of fins 230 may be used to provide the channel region of one or more transistors, such that fin portions 231 (the portions of fins 230 above the top plane of STI layer 220 after recess 114 has been performed) may be referred to as channel portions herein, for example. More specifically, the fin portion 231 under the gate structure to be subsequently formed is generally referred to as the channel portion, with the source and drain regions to be formed to either side of the channel portion, such that the channel is between the source and drain regions. Moreover, the portions of fins 230 below the top plane of STI layer 220 are indicated as portions 232, where such portions may be referred to as sub-channel portions, for example.

As shown in FIG. 2I, the portions 231 of fins 230 exuding above the top plane of STI layer 220 have a fin height indicated as Fh, which may be in the range of 4-800 nm (e.g., in the subrange of 4-10, 4-20, 4-50, 4-100, 4-200, 4-400, 10-20, 10-50, 10-80, 10-100, 10-200, 10-400, 10-800, 50-100, 50-200, 50-400, 50-800, 100-400, 100-800, 400-800 nm, or some other sub-range), for example, or any other suitable value or range, as will be apparent in light of this disclosure. In some specific embodiments, the fin heights Fh may be at least 10, 25, 35, 50, 75, 100, 125, 150, 175, 200, 300, 400, 500, 600, 700, or 800 nm tall. Also note that in embodiments employing planar transistor configurations, recess process 114 need not be performed, as the transistor may be formed using the top surface of semiconductor body 230 as shown in FIG. 2H, for example.

Figure 2J:
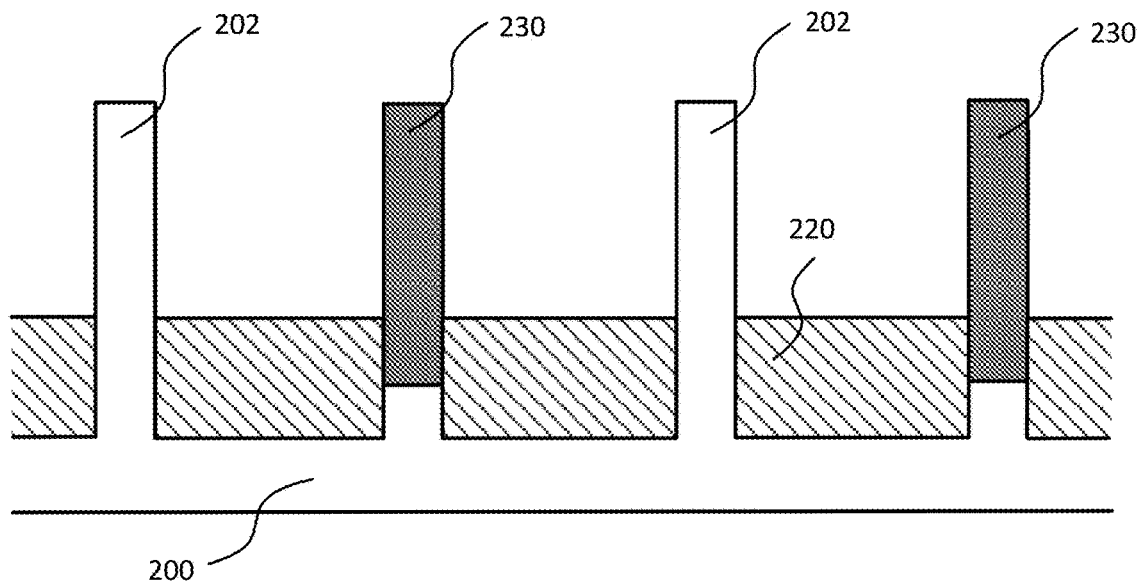
Figure 2J:
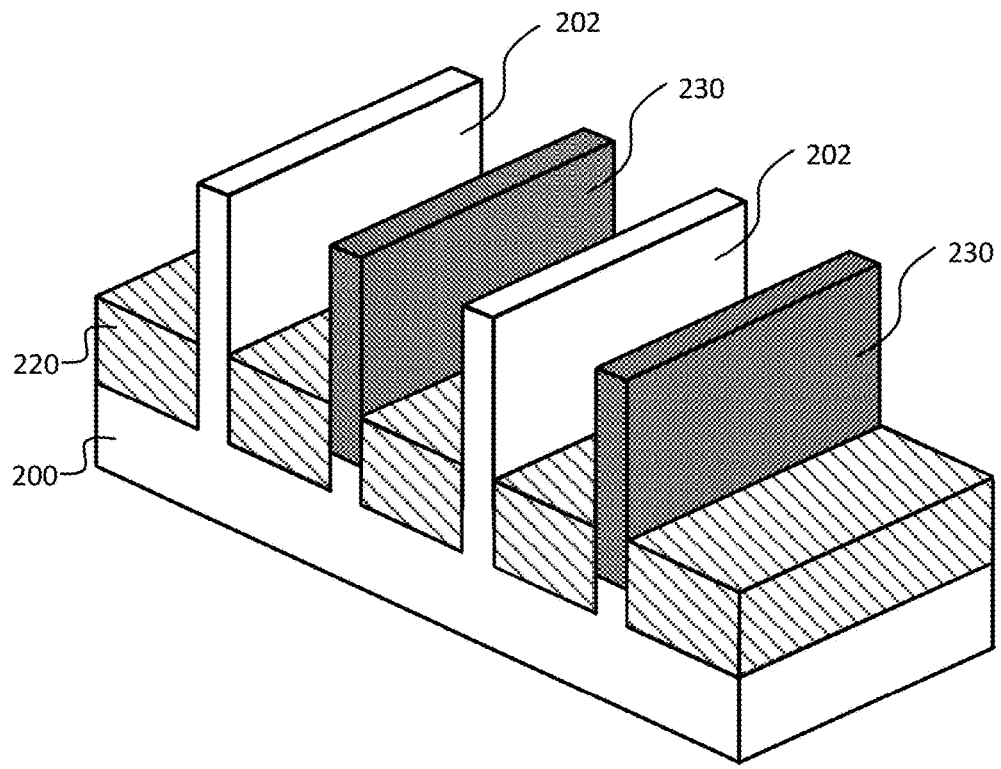

Note that all of the fins are shown as being replaced in the example embodiment of FIG. 2I; however, the present disclosure is not intended to be so limited. In some embodiments, as illustrated in FIG. 2J, only a subset may be replaced (e.g., such that some replacement fins 230 are available for subsequent processing and some native fins 202 remain for subsequent processing). FIG. 2J' illustrates this in a perspective view.

Figure 2K:
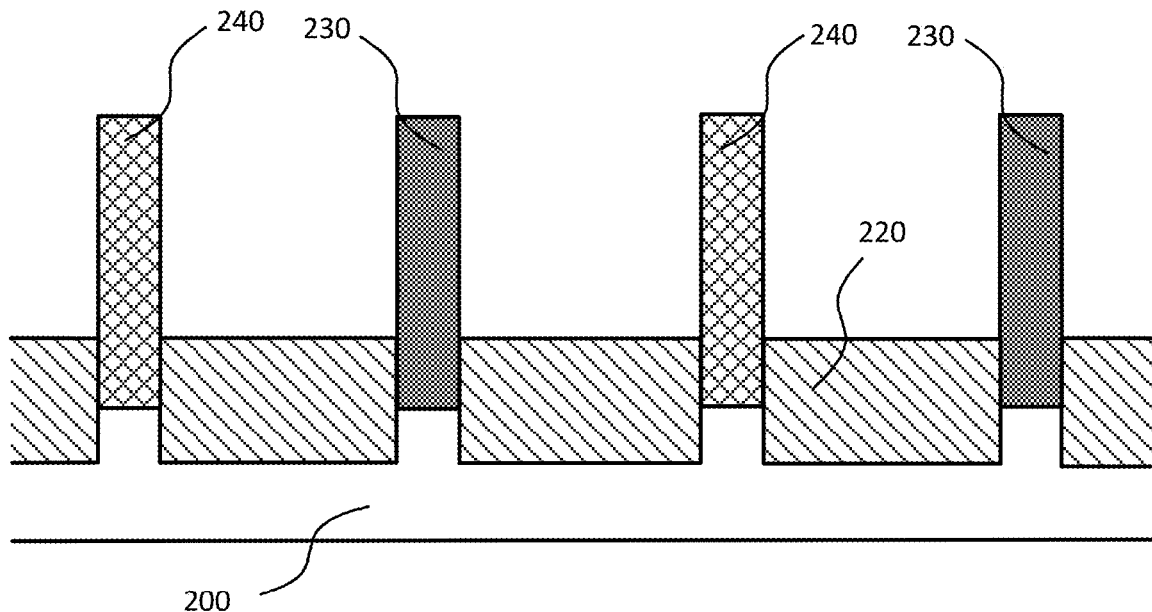
Figure 2K:
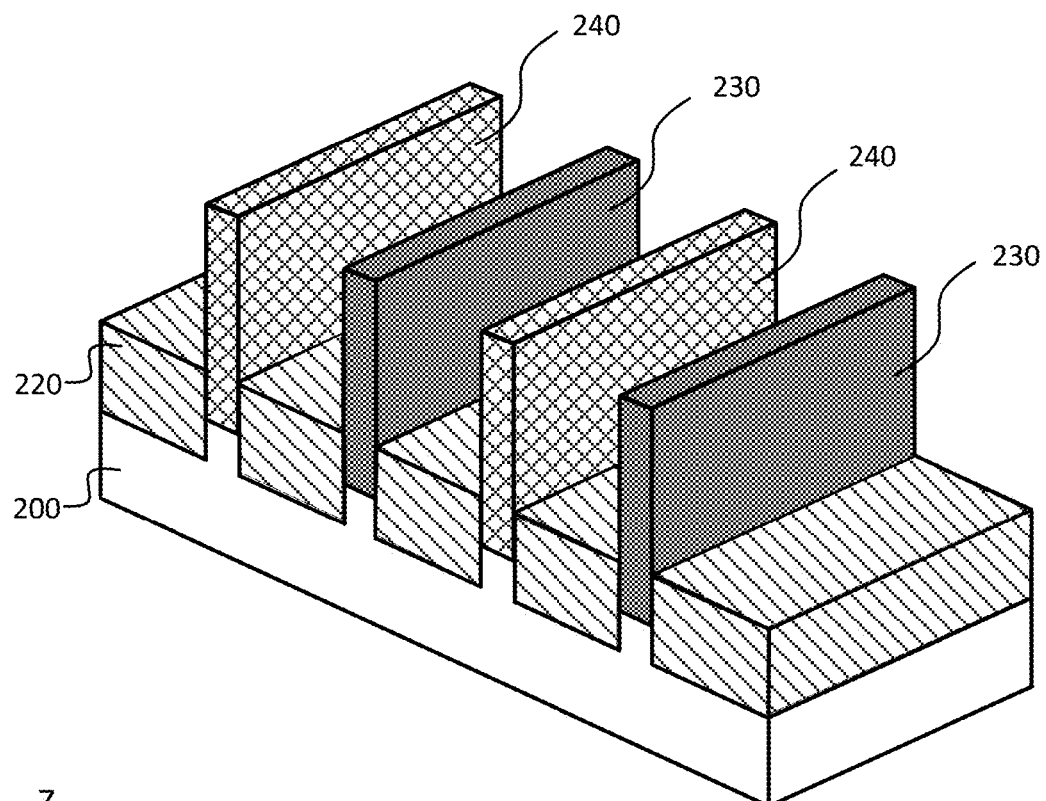

Further, in some embodiments, the recess and replace process may be performed as many times as desired to form as many subsets of replacement fins as desired by masking off the areas not to be processes for each replacement fin subset processing. This is illustrated, for example, in FIG. 2K where two different sets of replacement fins 230 and 240 are shown. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). So, for instance, some of the native fins 202 are removed and replaced with a first material 230 (e.g., Ge-rich material) and others of the native fins 202 are removed and replaced with a second material 240 (e.g., III-V material). FIG. 2K' illustrates this in a perspective view. In some embodiments, the removal and replacement of a fin with a Ge-rich material is performed after doping of the STI regions, as described below for box 120 of method 100, to inhibit diffusion of S/D dopant into the STI region.

Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing). Numerous such fin replacement schemes can be used, as will be apparent.

Figure 2L:
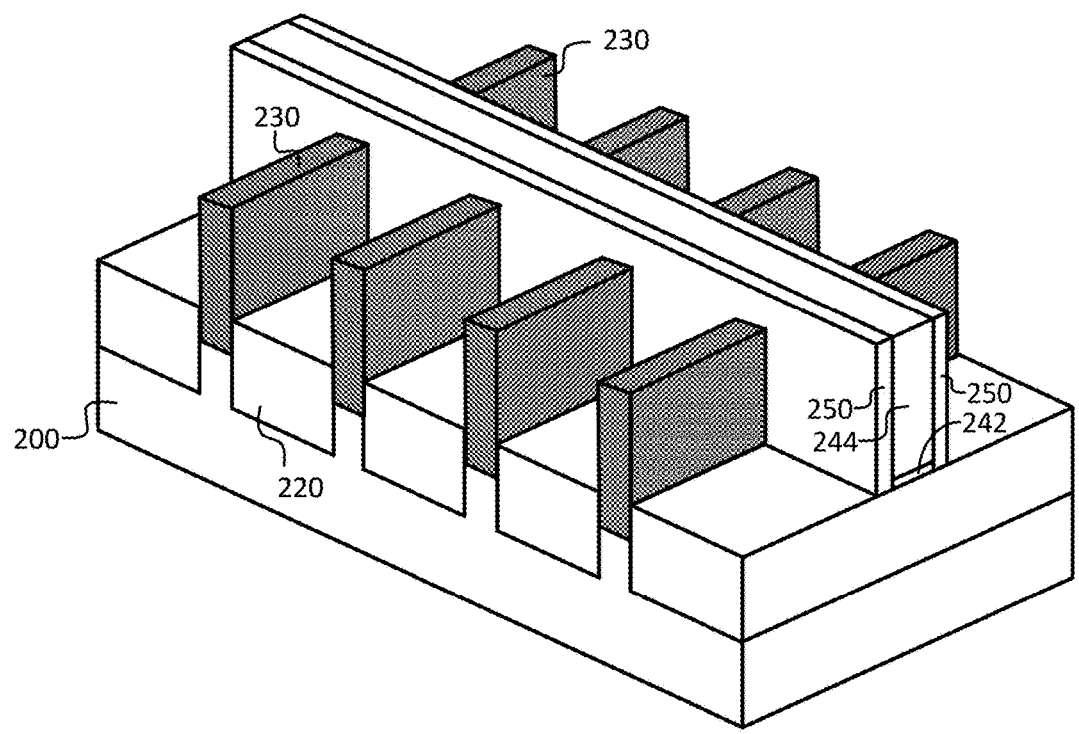
Figure 2L:
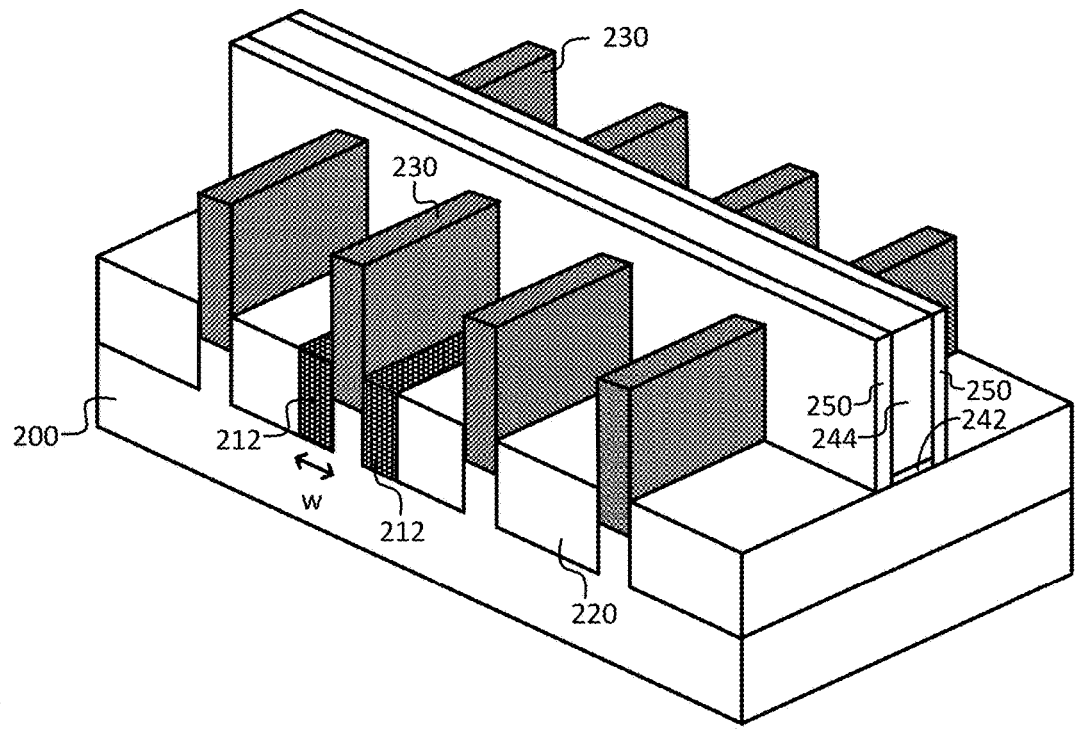
Figure 2L:
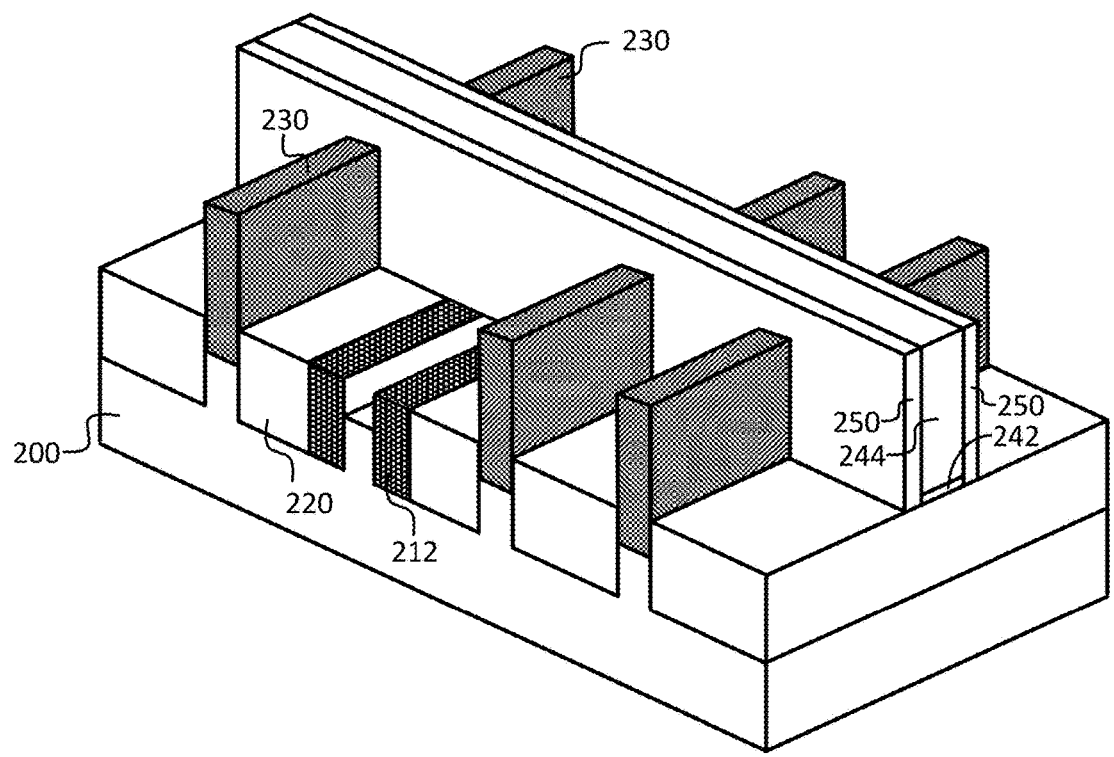
Figure 2L:
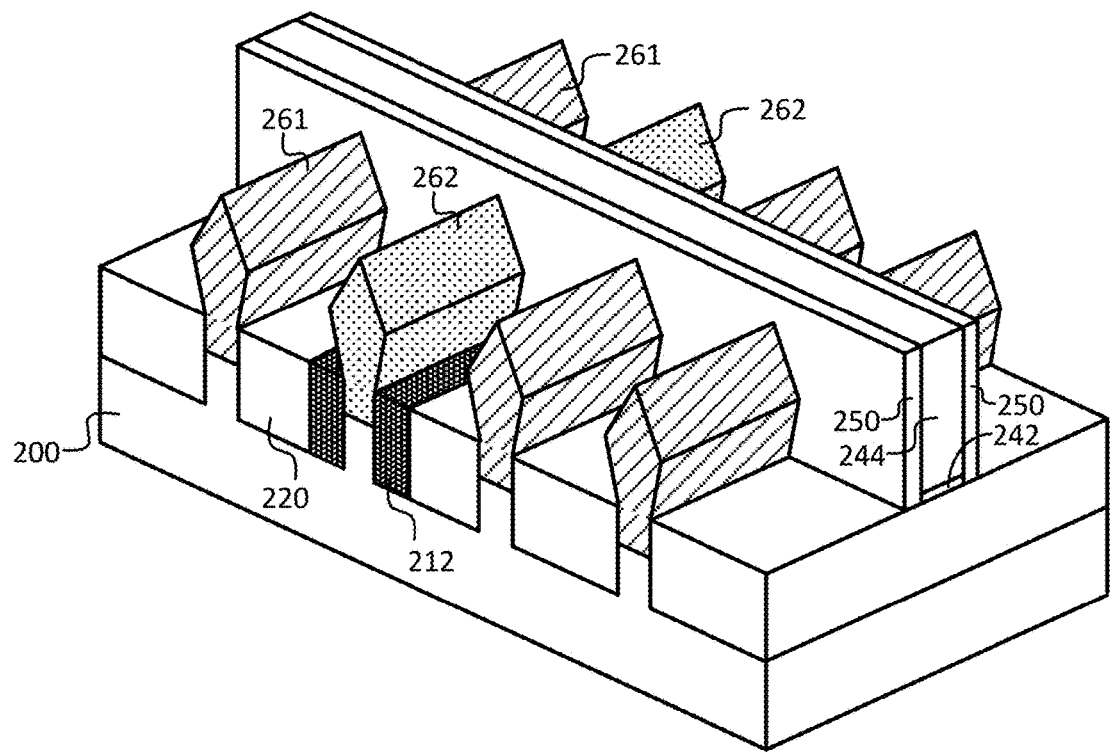

Method 100 of FIG. 1 (referring now to FIG. 1B) continues with optionally forming 116 a dummy gate stack to form the example resulting structure of FIG. 2L, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 116 (forming a dummy gate stack) would not be performed, and thus, process 116 may be optional in some embodiments (such as those employing the gate first process flow). This is reflected with the alternative location for performing 122 final gate stack processing, which is shown as the optional gate first flow 100' in FIG. 1, where performing 122 the final gate stack processing would instead occur at the location of box 116 in embodiments employing a gate first process flow, for example. However, the description of method 100 will continue using a gate last process flow, to allow for such a flow (which generally includes additional processing) to be adequately described.

Continuing with forming 116 a dummy gate stack, such a dummy gate stack (where employed) may include dummy gate dielectric 242 and dummy gate electrode 244, thereby forming the example resulting structure of FIG. 2L, in this example embodiment. In this example embodiment, dummy gate dielectric 242 (e.g., dummy oxide material) and dummy gate electrode 244 (e.g., dummy poly-silicon material) may be used for a replacement gate process. Note that gate spacers 250, on either side of the dummy gate stack were also formed, and such gate spacers 250 can be used to help determine the channel length and/or to help with replacement gate processes, for example. As can be understood based on this disclosure, the dummy gate stack (and gate spacers 250) can help define the channel region and source/drain (S/D) regions of each transistor device, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along the top and opposing sidewalls of the finned channel regions, in embodiments employing a finned (e.g., FinFET) configuration.

Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2L, for example. Gate spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, as previously described, the techniques described herein need not include forming a dummy gate stack, such that a final gate stack may be formed in the first instance. Regardless, the end structure will include a final gate stack, as will be apparent in light of this disclosure. Also note that in some embodiments, a hardmask may be formed over the dummy gate stack (which may or may not also be formed over gate spacers 250) to protect the dummy gate stack during subsequent processing, for example. The previous relevant description of hardmask 210 is equally applicable to such a hardmask feature, where employed.

Method 100 of FIG. 1 continues with performing doping 118 of STI regions to form the example resulting structure of FIG. 2L', in accordance with some embodiments. An n-type dopant, such as P or As, is implanted in the STI region 212 adjacent the regions of fin 230 that will become the Ge-rich S/D regions. The n-type impurity is implanted in the STI region 212 after forming the gate structure, so that the gate structure prevents dopant implantation in regions of the STI adjacent to the channel region under the gate structure. As can be understood based on this disclosure, the introduction of n-type dopant in the STI region helps to inhibit the undesired diffusion of n-type dopant or impurities (e.g., P, or As) of the S/D regions (that will be subsequently created) into the adjacent STI regions, particularly in the context of a n-type Ge-rich n-MOS devices. Although the illustration in FIG. 2L' shows only one example of a pair of doped STI regions 212 adjacent to a single fin 230, the present disclosure is not intended to be so limited. Doped STI regions 212 may be employed to limit undesired diffusion from any number of S/D regions. In some embodiments, the concentration of n-type impurity implanted in the STI material proximate the source/drain regions is in the range of 1 to 10 atomic %. In some embodiments, the thickness of the n-doped STI region (shown as w along the X-axis direction in FIG. 2L') is in the range of 10 nanometers to 100 nanometers. Note that not all of the STI region is necessarily doped; rather, just the portions adjacent to either side of the source region and either side of the drain region. In some embodiments, a patterned masking layer may be employed (e.g., spin on or hardmask) to define the region to be implanted.

In general, the doped STI region 212 can be any material or composition that reduces or inhibits the depletion of S/D dopant that would otherwise be allowed to leave the S/D faster than it is replenished. The doped STI region 212 provides a benefit since dopant that would otherwise leave the S/D regions and move into the neighboring undoped STI regions 220, particularly in the context of an n-type Ge-rich channel device, is no longer available to activate free electrons in the S/D and therefore contributes to degraded device performance. In some embodiments, the concentration of dopant, in the doped STI region 212, adjacent to n-type Ge S/D will exceed 2E21 phosphorous and arsenic atoms per cubic cm. This concentration is distinguishable from unintentional n-type dopant diffusion from the Ge S/D to adjacent undoped STI regions, in the absence of a doped STI region 212, where the concentration of phosphorous and arsenic atoms would be graded downward from a peak of about 7E20 atoms per cubic cm.

Method 100 of FIG. 1 continues with performing 120 the source/drain (S/D) region processing to form the example resulting structure of FIG. 2L''', in accordance with some embodiments. The S/D region processing 120 may include an etch and replace process, where portions of the replacement fins 230 are removed in the S/D regions by way of a selective etch (or any other suitable etch scheme), yielding the example structure of FIG. 2L". It will be appreciated that, although FIG. 2L" shows the entire replacement material that occupies the source/drain region as being removed, in some embodiments the process may remove only a portion of the replacement material. In still other embodiments, the process may remove the entire replacement material in the source/drain as well as a portion of the native selection fin.

The process may continue with epitaxial deposition of the desired S/D material thereby forming the bulk S/D regions 261, yielding the example structure of FIG. 2L''', in this example embodiment. In some embodiments, S/D regions 261 can be formed using any suitable techniques, such as one or more of the deposition processes described herein (e.g., CVD, ALD, PVD, MBE), and/or any other suitable processes as will be apparent in light of this disclosure. In some such embodiments, S/D regions 261 may be formed using a selective deposition process, e.g., such that the material of the features only or significantly only grows (or only grows in a monocrystalline structure) from the exposed semiconductor material, as can be understood based on this disclosure. In other embodiments, the S/D regions 261 are implantation doped portions of the fins (202, 230, 240).

Note that the S/D regions 261 are referred to herein as such for ease of description, but each S/D region may be either a source region or a drain region, such that the corresponding S/D region (on the other side of the channel region, and thus, on the other side of the dummy gate stack) is the other of the source region and drain region, thereby forming a source and drain region pair. For instance, as shown in FIG. 2L', there are four channel regions and four corresponding S/D region 261 pairs.

In some embodiments, the S/D region 261 may include any suitable semiconductor material as will be apparent in light of this disclosure, such as monocrystalline group IV semiconductor material. For instance, a given S/D region may include at least one of Si, Ge, Sn, and C. In some embodiments, a given S/D region may or may not include n-type and/or p-type dopant (such as in one of the schemes described herein). Where present, the dopant may be included in a concentration in the range of 1E17 to 5E21 atoms per cubic cm or greater, for example. In some embodiments, a given S/D region may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the corresponding S/D contact, which may be achieved using any suitable processing, such as tuning the amount of dopant in the reactant flow (e.g., during an in-situ doping scheme), to provide an example. In some embodiments, a given S/D 261 region may include a multilayer structure that includes at least two compositionally different material layers. For instance, in the case of a Fermi Field FET (FFFET) device, the source region may include a multilayer structure that includes a p-type doped region and n-type doped region, in accordance with some embodiments. In some embodiments, a given S/D region 261 may be raised such that it extends higher than a corresponding channel region (e.g., in the vertical or Y-axis direction).

In some embodiments, S/D region 261 may have different shapes and configurations, depending on the forming processes used, as will be apparent in light of this disclosure. For instance, in the example structure of FIG. 2L''' the S/D regions include three-dimensional diamond shapes, with two top surfaces that are faceted (e.g., with {111} faceting) as shown. Other example structures may be formed, in accordance with some embodiments, including a rounded (or curved) and unfaceted top, and the rounded or curved S/D region may extend past the underlying sub-fin portion in the X-axis direction. As can be understood based on this disclosure, S/D regions including any shape (such as the diamond shape of S/D region 261, or a rounded shape) can benefit from the techniques described herein.

In some embodiments, one of the S/D regions in a corresponding S/D region pair (such as region 261 on one side of the dummy gate stack) may be processed separately than the other S/D region in that pair (such as region 261 on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

Figure 2M:
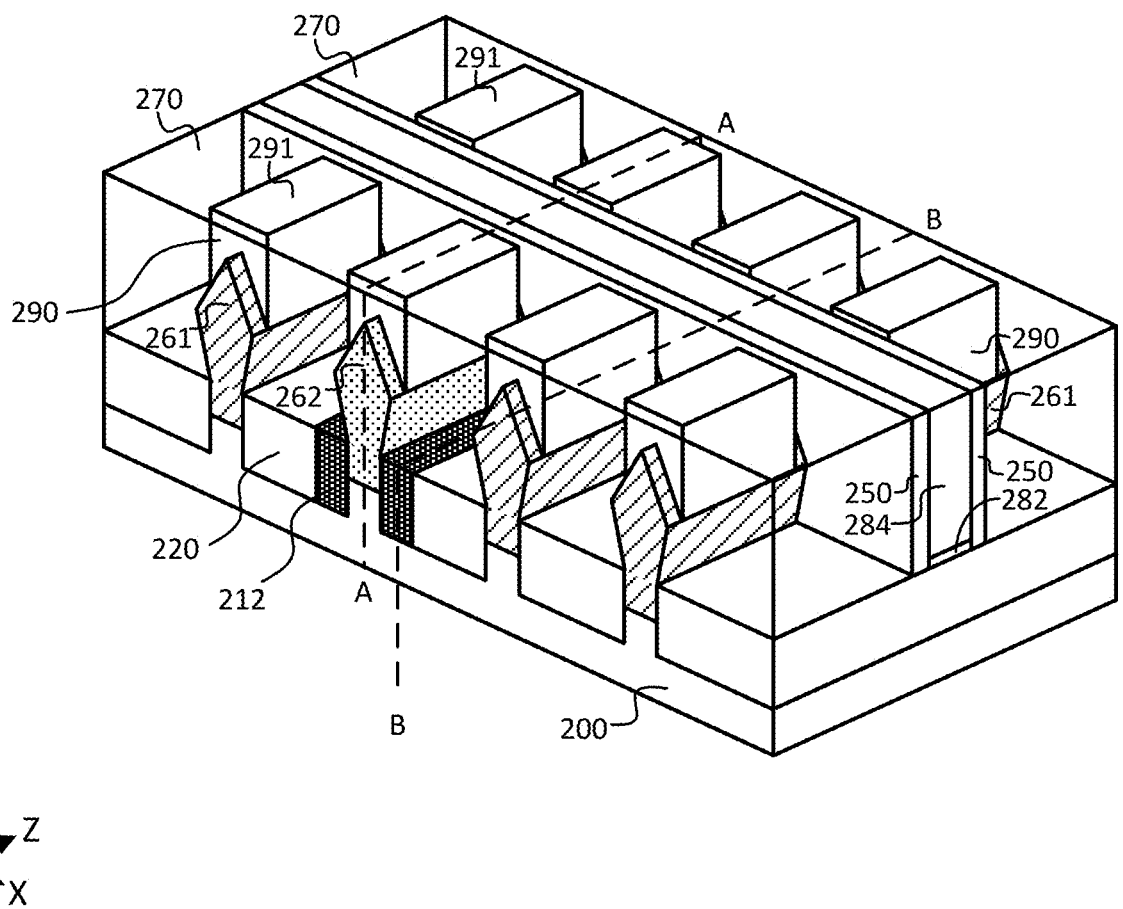
Figure 2N:
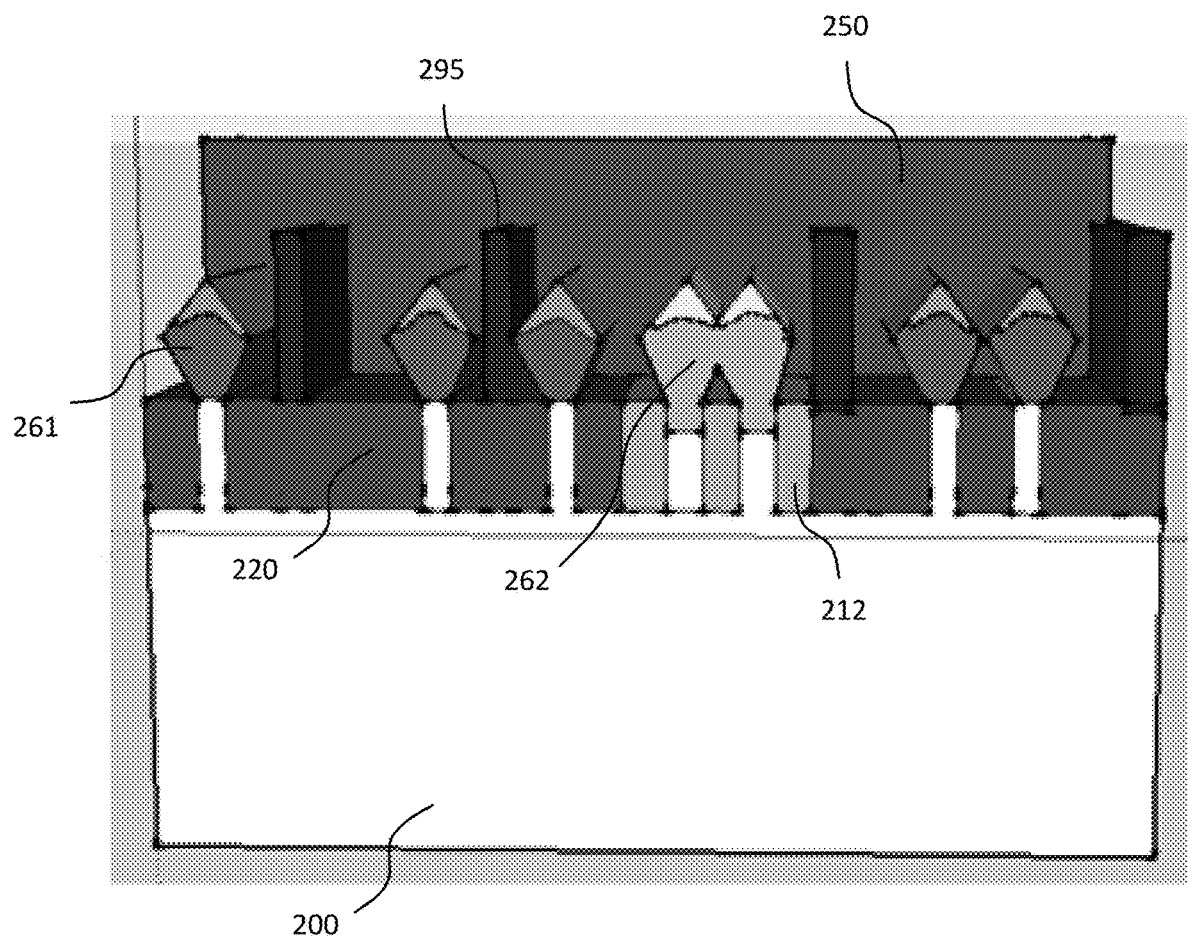

Method 100 of FIG. 1 continues with performing 122 the final gate stack processing to form the example resulting structure of FIG. 2M, in accordance with some embodiments. As shown in FIG. 2M, the processing in this example embodiment included depositing interlayer dielectric (ILD) layer 270 on the structure of FIG. 2L''', followed by planarization and/or polishing (e.g., CMP) to reveal the dummy gate stack. Note that ILD layer 270 may include a multilayer structure, even though it is illustrated as a single layer. Further note that in some cases, ILD layer 270 and STI material 220 may not include a distinct interface as shown in FIG. 2M, particularly where, e.g., the ILD layer 270 and STI material 220 include the same dielectric material (e.g., where both include silicon dioxide). In general, the ILD layer 270 may include any desired electrical insulator, dielectric, oxide (e.g., silicon oxide), and/or nitride (e.g., silicon nitride) material, as will be apparent in light of this disclosure.

The gate stack processing, in this example embodiment, continues with removing the dummy gate stack (including dummy gate 244 and dummy gate dielectric 242) to allow for the final gate stack to be formed. Recall that in some embodiments, the formation of the final gate stack, which includes gate dielectric 282 and gate electrode 284, may be performed using a gate first flow. In such embodiments, the final gate stack processing may have been alternatively performed at box 116, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 282 and gate electrode 284 as shown in FIG. 2M and described herein.

Note that when the dummy gate is removed, the channel region of fins 202 (or replacement fins 230, 240), which is the portion of the fins that were covered by the dummy gate stack, are exposed to allow for any desired processing of those channel regions. Such processing of a given channel region may include various different techniques, such as removing and replacing the channel region with replacement material, doping the channel region as desired, forming the channel region into one or more nanowires (or nanoribbons) for a gate-all-around (GAA) transistor configuration, cladding the channel region, cleaning/polishing the channel region, and/or any other suitable processing as will be apparent in light of this disclosure.

In some embodiments, a given channel region of a transistor device may include monocrystalline Ge-rich group IV semiconductor material, such as monocrystalline Ge or monocrystalline SiGe with over 50% Ge by atomic percentage, and/or any other suitable material as will be apparent in light of this disclosure. In general, a given channel region may include at least one of silicon (Si) and germanium (Ge), to provide some examples. In some embodiments, the channel region may be lightly doped (e.g., with any suitable n-type and/or p-type dopant) or intrinsic/undoped (or nominally undoped, with a dopant concentration less than 1E16 atoms per cubic cm), depending on the particular configuration. In some embodiments, a given channel region may include grading (e.g., increasing and/or decreasing) of the concentration of one or more materials within the feature, such as the grading of a semiconductor material component concentration and/or the grading of the dopant concentration, for example. In some embodiments, a given channel region may include a multilayer structure that includes at least two compositionally different material layers. As can be understood based on this disclosure, the channel region is at least below the gate stack, in this example embodiment. For instance, in the case of a finned transistor configuration, the channel region may be below and between the gate stack, as the stack is formed on a top and opposing sides of a semiconductor body or fin. However, if the transistor device were inverted and bonded to what will be the end substrate, then the channel region may be above the gate. Therefore, in general, the gate structure and channel region may include a proximate relationship, where the gate structure is near the channel region such that it can exert control over the channel region in an electrical manner, in accordance with some embodiments. Further, in the case of a nanowire (or nanoribbon or GAA) transistor configuration, the gate stack may completely surround each nanowire/nanoribbon in the channel region (or at least substantially surround each nanowire, such as surrounding at least 70, 80, or 90% of each nanowire). Further still, in the case of a planar transistor configuration, the gate stack may simply be above the channel region.

Note that the S/D regions 261 are adjacent to either side of a corresponding channel region, such as can be seen in FIG. 2M, for example. Also note that the configuration/ geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may structurally be very similar (or the same), but they include different doping schemes (e.g., source-drain doping schemes for MOSFET of p-p or n-n versus p-n or n-p for TFET).

Continuing with performing 122 final gate stack processing, after the dummy gate has been removed and any desired channel region processing has been performed, the final gate stack can then be formed, in accordance with some embodiments. In this example embodiment, the final gate stack includes gate dielectric 282 and gate electrode 284, as shown in FIG. 2M. The gate dielectric 282 may include any suitable dielectric (such as silicon dioxide, and/or a high-k dielectric material), as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as various suitable metals or metal alloys, such as aluminum (Al), tungsten (W), titanium (Ti), tantalum (Ta), copper (Cu), and carbides and nitrides thereof, for example. In some embodiments, gate dielectric 282 and/or gate electrode 284 may include a multilayer structure of two or more material layers, for example. For instance, in one embodiment, the gate dielectric includes a first layer of silicon dioxide on the channel region, and a second layer of hafnium oxide on the first layer. That gate electrode may include, for instance, a metal plug along with one or more workfunction layers, resistance-reducing layers, and/or barrier layers. In some embodiments, gate dielectric 282 and/or gate electrode 284 may include grading (e.g., increasing and/or decreasing) the content/concentration of one or more materials in at least a portion of the feature(s). Note that although gate dielectric 282 is only shown below gate electrode 284 in the example embodiment of FIG. 2M, in other embodiments, the gate dielectric 282 may also be present on one or both sides of gate electrode 284, such that the gate dielectric 282 is u-shaped (in a cross-sectional profile) may also be between gate electrode 284 and one or both of gate spacers 250, for example. Numerous different gate stack configurations will be apparent in light of this disclosure.

Method 100 of FIG. 1 continues with performing 124 S/D contact processing to form the example resulting structure of FIG. 2M, in accordance with some embodiments. S/D contact processing 124, in this example embodiment, first includes forming S/D contact trenches 290 above the S/D regions 261, as shown in FIG. 2M. In some such embodiments, the contact trenches 290 may be formed using any suitable techniques, such as performing one or more wet and/or dry etch processes to remove portions of ILD layer 270 as shown, and/or any other suitable processing as will be apparent in light of this disclosure. Such etch processing may be referred to as the S/D contact trench etch processing, or simply, contact trench etch processing. Further, in some such embodiments, the ILD may first be patterned such that areas that are not to be removed via the contact trench etch processing are masked off, for example. In some embodiments, one or more etch stop layers may have been formed on S/D regions 261 prior to performing the contact trench etch processing, to help with the controllability of the processing (e.g., to help stop the etching to help prevent the etching from consuming material of the S/D regions 261 in an undesired manner). In some such embodiments, the etch stop layer(s) may include insulator material that is dissimilar from the ILD 270 material (e.g., to provide relative etch selectivity) and/or material that is resilient to the contact trench etch, such as a carbon-based etch stop layer (e.g., with carbon concentration in the range of 1-80%).

Continuing from the example structure of FIG. 2M contact processing 124 includes forming S/D contacts 291 above respective S/D regions 261, in accordance with some embodiments. In the example structure of FIG. 2M, it can be understood that S/D contacts 291 are electrically connected to S/D regions 261, and in some cases, they may also be in physical contact with those S/D regions 261. In some embodiments, S/D contacts 291 may be formed using any suitable techniques, such as depositing metal or metal alloy (or other suitable electrically conductive material) in contact trenches 290. In some embodiments, S/D contact 291 formation may include silicidation, germanidation, and/or annealing processes, for example, where such processing may be performed to form an intervening contact layer before forming the bulk contact metal structure, for instance. In some embodiments, S/D contacts 291 may include aluminum or tungsten, although any suitable conductive metal or alloy can be used, such as silver, nickel-platinum, or nickel-aluminum, for example. Generally, in some embodiments, one or more of the S/D contacts 291 may include a resistance reducing metal and a contact plug metal, or just a contact plug, for instance. Example contact resistance reducing metals include, for instance, nickel, aluminum, titanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, S/D contacts 291 may employ low work-function metal material(s) and/or high work-function metal material(s), depending on the particular configuration. In some embodiments, additional layers may be present in the S/D contact regions, such as adhesion layers (e.g., titanium nitride) and/or liner or barrier layers (e.g., tantalum nitride), if so desired.

FIG. 2N illustrates another view in 3 dimensions (x,y,z) of the example structure of FIG. 2L', according to an embodiment. Shown in this figure are the substrate 200, the STI regions 220, and the doped STI regions 212. Also shown in the background is gate spacer 250. Both p-MOS 261 and n-MOS 262 replacement S/D material are shown after, for example, epitaxial S/D processing. Additionally, S/D isolation walls 295 are shown in this example embodiment.

Figure 3A:
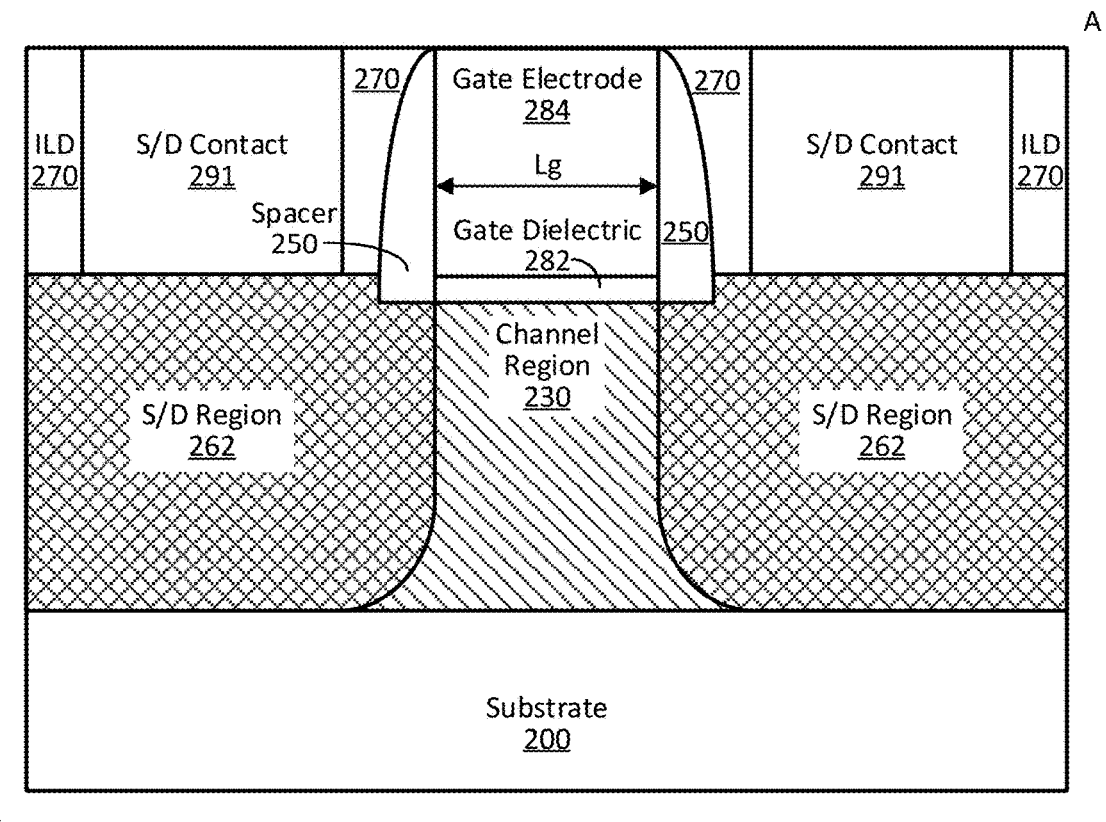
FIG. 3A illustrates an example cross-sectional view along the plane A-A in FIG. 2M, in accordance with some embodiments.
Figure 3A:
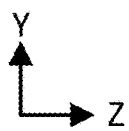

FIG. 3A illustrates an example cross-sectional view along the plane A-A in FIG. 2M, in accordance with some embodiments. The cross-sectional view of FIG. 3A is provided to assist in illustrating different features of the structure of FIG. 2M. Therefore, the relevant description with respect to each similarly numbered feature is equally applicable to FIG. 3A. However, note that the dimensions of the features shown in FIG. 3A may differ relative to the features in FIG. 2M, for ease of illustration. Also note that some variations occur between the structures, such as the shape of gate spacers 250 and the shape of finned channel region 230, for example. Further note that channel region 230 shown in FIG. 3A is not native to substrate 200; however, in other embodiments, the channel region (and thus, the material of that channel region) may be native to substrate 200. Further still, note that the particular S/D configuration employed in the structure of FIG. 3A is the same S/D configuration from FIG. 2M.

In some embodiments, the length of gate electrode 284 (e.g., the dimension between spacers 250 in the Z-axis direction), which is indicated as Lg in FIG. 3A, may be any suitable length as will be apparent in light of this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm) or greater, for example. In some embodiments, the gate length may be less than a given threshold, such as less than 100, 50, 45, 40, 35, 30, 25, 20, 15, 10, 8, or 5 nm, or less than some other suitable threshold as will be apparent in light of this disclosure. In some embodiments, the techniques enable maintaining a desired device performance when scaling to such low thresholds, such as sub-50, sub-40, sub-30, or sub-20 nm thresholds and beyond, as can be understood based on this disclosure. For instance, the techniques as variously described herein can reduce short channel effects, thereby increasing the effective channel length (dimension between the S/D regions in the Z-axis direction). Further, the techniques described herein may allow the gate length and the effective channel length to be the same or approximately the same, in accordance with some embodiments. For instance, in some such embodiments, being approximately the same with respect to the effective channel length and the gate length may include that the effective channel length is within 1-10 nm (e.g., within 1, 2, 3, 4, 5, 6, 7, 8, 9, or 10 nm) or within 1-10% (e.g., within 1, 2, 3, 4, 5, 6, 7, 8, 9, or 10%) different (e.g., shorter) than the gate length.

Figure 3B:
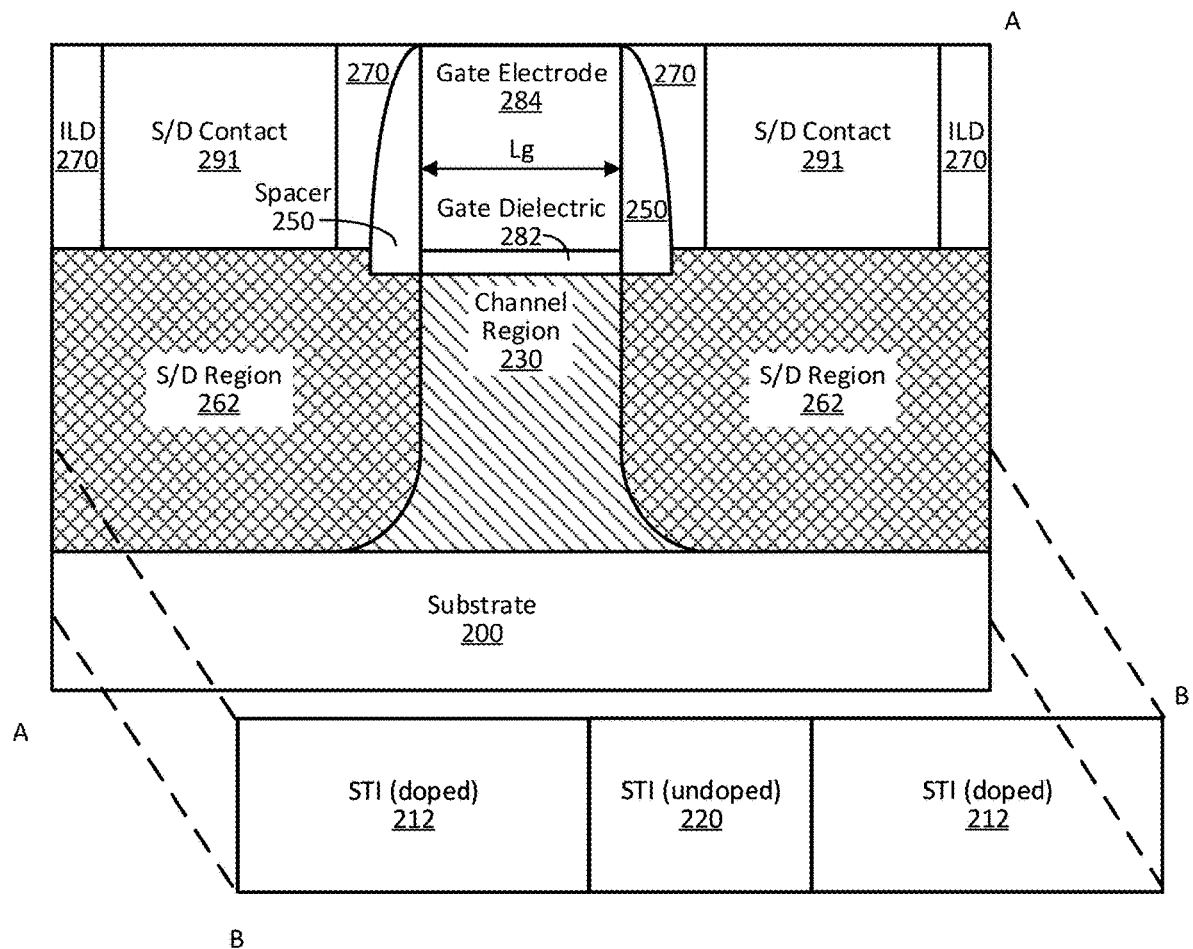
FIG. 3B illustrates an example cross-sectional view along the planes A-A and B-B in FIG. 2M, in accordance with some embodiments.

FIG. 3B illustrates the example cross-sectional view along the plane A-A in FIG. 2M in combination with a cross-section of the STI region along the plane B-B in FIG. 2M, in accordance with some embodiments. The cross-sectional views of FIG. 3B are provided to assist in illustrating the relative alignments of the doped 212 and undoped 220 STI regions relative to S/D regions and channel regions of the structures of FIG. 2M. In particular, the performance of implantation doping of the STI region after gate stack processing allows for the portion of the STI region adjacent to the channel region to remain undoped.

Method 100 of FIG. 1 continues with completing 126 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 102-126 of method 100 are shown in a particular order for ease of description. However, one or more of the processes 102-126 may be performed in a different order or may not be performed at all. For example, box 116 is an optional process that need not be performed in embodiments employing a gate first process flow. Recall that the techniques may be used to form a multitude of different transistor types and configurations. Although the techniques are primarily depicted and described herein in the context of employing a doped STI region to reduce undesired diffusion of n-type impurities from source/drain structures to STI regions of a given n-MOS transistor having a Ge-rich channel region, the present disclosure is not intended to be so limited, as the techniques may be used to benefit only one side of a given channel region, and not the other, in some embodiments. Numerous variations and configurations will be apparent in light of the present disclosure.

Example System

Figure 4:
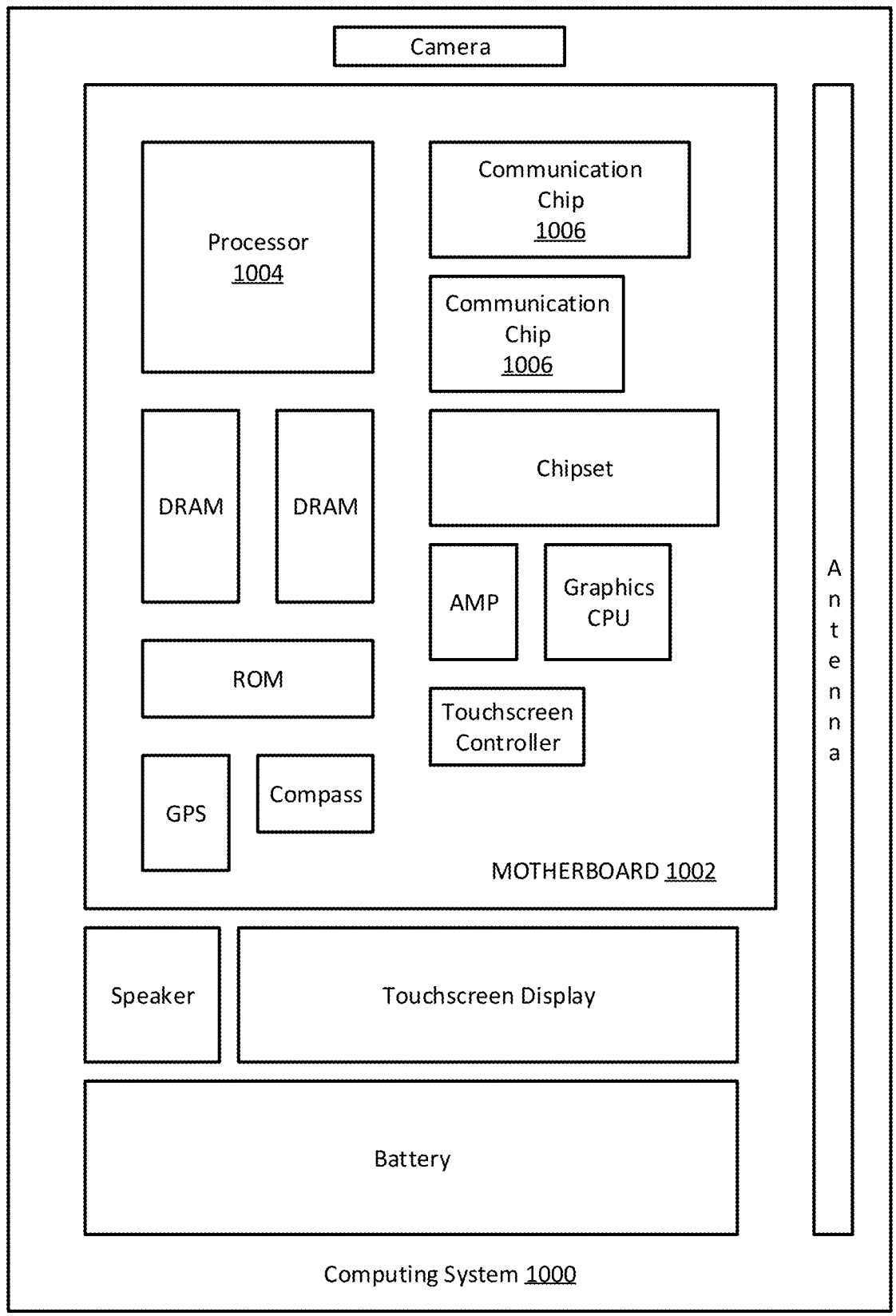
FIG. 4 illustrates a computing system implemented with integrated circuit structures and/or transistor devices formed using the techniques disclosed herein, in accordance with some embodiments of the present disclosure.

FIG. 4 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit (IC) comprising: a semiconductor body including at least 75% germanium by atomic percentage; a gate structure on the semiconductor body, the gate structure including a gate dielectric and a gate electrode; a source region and a drain region both adjacent to the gate structure such that the gate structure is between the source and drain regions, at least one of the source region and the drain region including n-type impurity; and a shallow trench isolation (STI) region adjacent the at least one of the source region and the drain region, the STI region including the n-type impurity.

Example 2 includes the subject matter of example 1, wherein the n-type impurity is phosphorous.

Example 3 includes the subject matter of examples 1 or 2, wherein the concentration of the n-type impurity in the STI region is in the range of 1 to 10 atomic %.

Example 4 includes the subject matter of any of examples 1-3, further comprising an extension of the STI region, the extension of the STI region adjacent a region of the semiconductor body beneath the gate structure, the extension of the STI region not including the n-type impurity.

Example 5 includes the subject matter of any of examples 1-4, wherein the thickness of the STI region is in the range of 10 nanometers to 100 nanometers, the thickness being the distance between the at least one of the source region and the drain region, and a second STI region, the second STI region associated with an adjacent second semiconductor body.

Example 6 includes the subject matter of any of examples 1-5, wherein the semiconductor body further includes at least one of silicon, indium, gallium, arsenic, antimony, and nitrogen.

Example 7 includes the subject matter of any of examples 1-6, wherein the germanium concentration of the semiconductor body is 98 atomic percent or more.

Example 8 includes the subject matter of any of examples 1-7, wherein the semiconductor body further includes up to 2% tin by atomic percentage.

Example 9 includes the subject matter of any of examples 1-8, wherein in addition to the n-type impurity, the source region and drain region are compositionally distinct from the semiconductor body, the source region and drain region including at least one of silicon and germanium.

Example 10 includes the subject matter of any of examples 1-9, wherein in addition to the n-type impurity, the source region and drain region are compositionally different from the semiconductor body, the source region and drain region further including at least one of silicon, indium, gallium, arsenic, antimony, and nitrogen.

Example 11 includes the subject matter of any of examples 1-10, wherein the source region and drain region further include up to 2% tin by atomic percentage.

Example 12 includes the subject matter of any of examples 1-11, wherein the n-type impurity is arsenic.

Example 13 includes the subject matter of any of examples 1-12, wherein the n-type impurity included in the STI region adjacent the at least one of the source region and the drain region, includes a chemical composition that provides diffusion resistance properties.

Example 14 includes the subject matter of any of examples 1-13, wherein the semiconductor body is on a fin stub, and the STI region is on opposing sidewalls of the fin stub as well as opposing sidewalls of the semiconductor body.

Example 15 includes the subject matter of any of examples 1-14, wherein the at least one of the source region and the drain region is on the fin stub, and the STI region is on opposing sidewalls of the fin stub as well as opposing sidewalls of the at least one of the source region and the drain region.

Example 16 includes the subject matter of any of examples 1-15, wherein the fin stub is part of an underlying semiconductor substrate.

Example 17 includes the subject matter of any of examples 1-16, wherein the substrate is silicon and the semiconductor body includes at least one of germanium, gallium, arsenic, indium, antimony, and nitrogen.

Example 18 includes the subject matter of any of examples 1-17, wherein the at least one of the source region and the drain region extends above an uppermost surface of the STI region.

Example 19 includes the subject matter of any of examples 1-18, further comprising interlayer dielectric (ILD) material on an upper portion of the least one of the source region and the drain region.

Example 20 includes the subject matter of any of examples 1-19, further comprising a first contact structure in the ILD material and on the source region, and a second contact structure in the ILD material and on the drain region.

Example 21 includes the subject matter of any of examples 1-20, wherein ILD material is on the uppermost surface of the STI region.

Example 22 includes the subject matter of any of examples 1-21, wherein the semiconductor body is a fin.

Example 23 includes the subject matter of any of examples 1-22, wherein the semiconductor body includes one or more nanowires.

Example 24 includes the subject matter of any of examples 1-23, wherein the semiconductor body includes one or more nanoribbons.

Example 25 includes the subject matter of any of examples 1-24, wherein at least one of the gate dielectric and the gate electrode is on an uppermost surface of the STI region.

Example 26 includes the subject matter of any of examples 1-25, wherein the gate structure further includes a first gate spacer between the source region and the gate electrode, a second gate spacer between the drain region and the gate electrode.

Example 27 includes the subject matter of any of examples 1-26, wherein at least one of the first gate spacer and the second gate spacer is on an uppermost surface of the STI region.

Example 28 is a computing system comprising the IC of any of examples 1-27.

Example 29 is a method of forming an integrated circuit (IC), the method comprising: forming a semiconductor body including at least 75% germanium by atomic percentage; forming a gate structure on the semiconductor body, the gate structure including a gate dielectric and a gate electrode; forming a source region and a drain region both adjacent to the gate structure such that the gate structure is between the source and drain regions, at least one of the source region and the drain region including n-type impurity; and forming a shallow trench isolation (STI) region adjacent the at least one of the source region and the drain region, the STI region including the n-type impurity.

Example 30 includes the subject matter of example 29, wherein the n-type impurity is phosphorous.

Example 31 includes the subject matter of examples 29 or 30, wherein the concentration of the n-type impurity in the STI region is in the range of 1 to 10 atomic %.

Example 32 includes the subject matter of any of examples 29-31, further comprising performing implantation of the n-type impurity in the STI region after forming the gate structure.

Example 33 includes the subject matter of any of examples 29-32, wherein the STI region adjacent a region of the semiconductor body beneath the gate structure does not include the n-type impurity.

Example 34 includes the subject matter of any of examples 29-33, wherein the thickness of the STI region is in the range of 10 nanometers to 100 nanometers, the thickness being the distance between the at least one of the source region and the drain region, and a second STI region, the second STI region associated with an adjacent second semiconductor body.

Example 35 includes the subject matter of any of examples 29-34, wherein the semiconductor body further includes at least one of silicon, indium, gallium, arsenic, antimony, and nitrogen.

Example 36 includes the subject matter of any of examples 29-35, wherein the germanium concentration of the semiconductor body is 98 atomic percent or more.

Example 37 includes the subject matter of any of examples 29-36, wherein the semiconductor body further includes up to 2% tin by atomic percentage.

Example 38 includes the subject matter of any of examples 29-37, wherein in addition to the n-type impurity, the source region and drain region are compositionally distinct from the semiconductor body, the source region and drain region including at least one of silicon and germanium.

Example 39 includes the subject matter of any of examples 29-38, wherein in addition to the n-type impurity, the source region and drain region are compositionally different from the semiconductor body, the source region and drain region further including at least one of silicon, indium, gallium, arsenic, antimony, and nitrogen.

Example 40 includes the subject matter of any of examples 29-39, wherein the source region and drain region further include up to 2% tin by atomic percentage.

Example 41 includes the subject matter of any of examples 29-40, wherein the n-type impurity is arsenic.

Example 42 includes the subject matter of any of examples 29-41, wherein the n-type impurity included in the STI region adjacent the at least one of the source region and the drain region, includes a chemical composition that provides diffusion resistance properties.

Example 43 includes the subject matter of any of examples 29-42, wherein the semiconductor body is on a fin stub, and the STI region is on opposing sidewalls of the fin stub as well as opposing sidewalls of the semiconductor body.

example 44 includes the subject matter of any of examples 29-43, wherein the at least one of the source region and the drain region is on the fin stub, and the STI region is on opposing sidewalls of the fin stub as well as opposing sidewalls of the at least one of the source region and the drain region.

Example 45 includes the subject matter of any of examples 29-44, wherein the fin stub is part of an underlying semiconductor substrate.

Example 46 includes the subject matter of any of examples 29-45, wherein the substrate is silicon and the semiconductor body includes at least one of germanium, gallium, arsenic, indium, antimony, and nitrogen.

Example 47 includes the subject matter of any of examples 29-46, wherein the at least one of the source region and the drain region extends above an uppermost surface of the STI region.

Example 48 includes the subject matter of any of examples 29-47, further comprising forming interlayer dielectric (ILD) material on an upper portion of the least one of the source region and the drain region.

Example 49 includes the subject matter of any of examples 29-48, further comprising forming a first contact structure in the ILD material and on the source region, and a second contact structure in the ILD material and on the drain region.

Example 50 includes the subject matter of any of examples 29-49, wherein ILD material is on the uppermost surface of the STI region.

Example 51 includes the subject matter of any of examples 29-50, wherein the semiconductor body is a fin.

Example 52 includes the subject matter of any of examples 29-51, wherein the semiconductor body includes one or more nanowires.

Example 53 includes the subject matter of any of examples 29-52, wherein the semiconductor body includes one or more nanoribbons.

Example 54 includes the subject matter of any of examples 29-53, wherein at least one of the gate dielectric and the gate electrode is on an uppermost surface of the STI region.

Example 55 includes the subject matter of any of examples 29-54, wherein the gate structure further includes a first gate spacer between the source region and the gate electrode, a second gate spacer between the drain region and the gate electrode.

Example 56 includes the subject matter of any of examples 29-55, wherein at least one of the first gate spacer and the second gate spacer is on an uppermost surface of the STI region.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An integrated circuit (IC) comprising:
   a body of semiconductor material including at least 75% germanium by atomic percentage, the body having an uppermost surface and a bottommost surface, wherein the body is directly on a fin stub, the fin stub directly on a semiconductor substrate, the fin stub comprising a semiconductor material different than the body of semiconductor material, and the semiconductor material of the fin stub the same as a semiconductor material of the semiconductor substrate;
   a gate structure on the body, the gate structure including a gate dielectric and a gate electrode;
   a source region and a drain region both adjacent to the body such that the body is between the source and drain regions, at least one of the source region and the drain region including an n-type impurity; and
   a shallow trench isolation (STI) region adjacent the at least one of the source region and the drain region, the STI region including the n-type impurity from an uppermost surface of the STI region to a bottommost surface of the STI region, wherein the uppermost surface of the STI region is below the uppermost surface of the body, wherein the bottommost surface of the STI region is below the bottommost surface of the body, wherein the uppermost surface of the STI region is above the bottommost surface of the body, and wherein the STI region is on opposing sidewalls of the fin stub.

2. The IC of claim 1, wherein the n-type impurity is phosphorous.

3. The IC of claim 1, wherein the n-type impurity is arsenic.

4. The IC of claim 1, wherein the concentration of the n-type impurity in the STI region is in the range of 1 to 10 atomic %.

5. The IC of claim 1, further comprising an extension of the STI region, the extension of the STI region adjacent a region of the body beneath the gate structure, the extension of the STI region not including the n-type impurity.

6. The IC of claim 1, wherein the thickness of the STI region is in the range of 10 nanometers to 100 nanometers, the thickness being the distance between the at least one of the source region and the drain region, and a second STI region, the second STI region associated with an adjacent second body of semiconductor material.

7. The IC of claim 1, wherein the body further includes at least one of silicon, indium, gallium, arsenic, antimony, and nitrogen.

8. The IC of claim 1, wherein the body further includes up to 2% tin by atomic percentage.

9. The IC of claim 1, wherein the germanium concentration of the body is 98 atomic percent or more.

10. The IC of claim 1, wherein in addition to the n-type impurity, the source region and drain region are compositionally distinct from the body, the source region and drain region including at least one of silicon and germanium.

11. The IC of claim 1, wherein in addition to the n-type impurity, the source region and drain region are compositionally different from the body, the source region and drain region further including at least one of silicon, indium, gallium, arsenic, antimony, and nitrogen.

12. The IC of claim 1, wherein the source region and drain region further include up to 2% tin by atomic percentage.

13. The IC of claim 1, wherein the n-type impurity included in the STI region adjacent the at least one of the source region and the drain region, includes a chemical composition that provides diffusion resistance properties.

14. The IC of claim 1, wherein the at least one of the source region and the drain region is on the fin stub, the STI region is on opposing sidewalls of the fin stub as well as opposing sidewalls of the at least one of the source region and the drain region, and the fin stub is part of an underlying substrate of semiconductor material.

15. The IC of claim 14, wherein the substrate is silicon and the body includes at least one of germanium, gallium, arsenic, indium, antimony, and nitrogen.

16. An integrated circuit (IC) comprising:
 a fin or nanowire including at least 75% germanium by atomic percentage, the fin or nanowire having an uppermost surface and a bottommost surface, wherein the fin or nanowire is directly on a fin stub, the fin stub directly on a semiconductor substrate, the fin stub comprising a semiconductor material different than the body of semiconductor material, and the semiconductor material of the fin stub the same as a semiconductor material of the semiconductor substrate;
 a gate structure on the fin or nanowire, the gate structure including a gate dielectric and a gate electrode;
 a source region and a drain region both adjacent to the fin or nanowire such that the fin or nanowire is between the source and drain regions, at least one of the source region and the drain region including an n-type impurity; and
 an isolation structure adjacent the at least one of the source region and the drain region, the isolation structure including insulation material and the n-type impurity, the n-type impurity included from an uppermost surface of the isolation structure to a bottommost surface of the isolation structure, wherein the uppermost surface of the isolation structure is below the uppermost surface of the fin or nanowire, wherein the bottommost surface of the isolation structure is below the bottommost surface of the fin or nanowire, wherein the uppermost surface of the isolation structure is above the bottommost surface of the fin or nanowire, and wherein the isolation structure is on opposing sidewalls of the fin stub.

17. The IC of claim 16, further comprising additional insulation material on an upper portion of the least one of the source region and the drain region.

18. An integrated circuit (IC) comprising:
 a body of semiconductor material including at least 75% germanium by atomic percentage, the body having an uppermost surface and a bottommost surface, wherein the body is directly on a fin stub, the fin stub directly on a semiconductor substrate, the fin stub comprising a semiconductor material different than the body of semiconductor material, and the semiconductor material of the fin stub the same as a semiconductor material of the semiconductor substrate;
 a gate structure on the body, the gate structure including a gate dielectric and a gate electrode;
 a source region and a drain region both adjacent to the body such that the body is between the source and drain regions, at least one of the source region and the drain region including an n-type impurity;
 a shallow trench isolation (STI) region adjacent the at least one of the source region and the drain region, the STI region including the n-type impurity from an uppermost surface of the STI region to a bottommost surface of the STI region, wherein the uppermost surface of the STI region is below the uppermost surface of the body, wherein the bottommost surface of the STI region is below the bottommost surface of the body, wherein the uppermost surface of the STI region is above the bottommost surface of the body, and wherein the STI region is on opposing sidewalls of the fin stub; and
 interlayer dielectric (ILD) material on an upper portion of the least one of the source region and the drain region.

19. The IC of claim 18, further comprising a first contact structure in the ILD material and on the source region, and a second contact structure in the ILD material and on the drain region.

20. An integrated circuit (IC) comprising:
 a body of semiconductor material including at least 75% germanium by atomic percentage, the body having an uppermost surface and a bottommost surface, wherein the body is directly on a fin stub, the fin stub directly on a semiconductor substrate, the fin stub comprising a semiconductor material different than the body of semiconductor material, and the semiconductor material of the fin stub the same as a semiconductor material of the semiconductor substrate;
 a gate structure on the body, the gate structure including a gate dielectric and a gate electrode;
 a source region and a drain region both adjacent to the body such that the body is between the source and drain regions, at least one of the source region and the drain region including an n-type impurity;
 a shallow trench isolation (STI) region adjacent the at least one of the source region and the drain region, the STI region including the n-type impurity from an uppermost surface of the STI region to a bottommost surface of the STI region, wherein the uppermost surface of the STI region is below the uppermost surface of the body, wherein the bottommost surface of the STI region is below the bottommost surface of the body, wherein the uppermost surface of the STI region is above the bottommost surface of the body, and wherein the STI region is on opposing sidewalls of the fin stub; and an extension of the STI region, the extension of the STI region adjacent a region of the body beneath the gate structure, the extension of the STI region not including the n-type impurity.

21. An integrated circuit (IC) comprising:

a body of semiconductor material including at least 75% germanium by atomic percentage, the body having an uppermost surface and a bottommost surface, wherein the body is on a fin stub, the fin stub comprising a semiconductor material different than the body of semiconductor material;

a gate structure on the body, the gate structure including a gate dielectric and a gate electrode;

a source region and a drain region both adjacent to the body such that the body is between the source and drain regions, at least one of the source region and the drain region including an n-type impurity;

a shallow trench isolation (STI) region adjacent the at least one of the source region and the drain region, the STI region including the n-type impurity from an uppermost surface of the STI region to a bottommost surface of the STI region, wherein the uppermost surface of the STI region is below the uppermost surface of the body, wherein the bottommost surface of the STI region is below the bottommost surface of the body, wherein the uppermost surface of the STI region is above the bottommost surface of the body, and wherein the STI region is on opposing sidewalls of the fin stub; and an extension of the STI region, the extension of the STI region adjacent a region of the body beneath the gate structure, the extension of the STI region not including the n-type impurity.

22. An integrated circuit (IC) comprising:

a body of semiconductor material including at least 75% germanium by atomic percentage, the body having an uppermost surface and a bottommost surface, wherein the body is on a fin stub, the fin stub comprising a semiconductor material different than the body of semiconductor material;

a gate structure on the body, the gate structure including a gate dielectric and a gate electrode;

a source region and a drain region both adjacent to the body such that the body is between the source and drain regions, at least one of the source region and the drain region including an n-type impurity; and a shallow trench isolation (STI) region adjacent the at least one of the source region and the drain region, the STI region including the n-type impurity from an uppermost surface of the STI region to a bottommost surface of the STI region, wherein the uppermost surface of the STI region is below the uppermost surface of the body, wherein the bottommost surface of the STI region is below the bottommost surface of the body, wherein the uppermost surface of the STI region is above the bottommost surface of the body, and wherein the STI region is on opposing sidewalls of the fin stub, wherein the n-type impurity included in the STI region adjacent the at least one of the source region and the drain region, includes a chemical composition that provides diffusion resistance properties.

* * * * *